United States Patent
Yuki et al.

(10) Patent No.: US 12,101,963 B2
(45) Date of Patent: Sep. 24, 2024

(54) DISPLAY DEVICE INCLUDING REFLECTIVE AND ABSORBING POLARIZERS

(71) Applicant: SHARP KABUSHIKI KAISHA, Sakai (JP)

(72) Inventors: Ryuzo Yuki, Sakai (JP); Kiyoshi Minoura, Sakai (JP); Kohzoh Nakamura, Sakai (JP); Akira Sakai, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 521 days.

(21) Appl. No.: 17/433,506

(22) PCT Filed: Mar. 1, 2019

(86) PCT No.: PCT/JP2019/008211
§ 371 (c)(1),
(2) Date: Aug. 24, 2021

(87) PCT Pub. No.: WO2020/178923
PCT Pub. Date: Sep. 10, 2020

(65) Prior Publication Data
US 2022/0158141 A1    May 19, 2022

(51) Int. Cl.
*H10K 50/86* (2023.01)
*G02B 5/30* (2006.01)
(Continued)

(52) U.S. Cl.
CPC ......... *H10K 50/868* (2023.02); *G02B 5/3083* (2013.01); *H10K 50/818* (2023.02);
(Continued)

(58) Field of Classification Search
CPC .. H10K 50/868; H10K 50/818; H10K 50/841; H10K 50/86; H10K 50/844;
(Continued)

(56) References Cited

U.S. PATENT DOCUMENTS 6,094,242 A  *  7/2000  Yamanaka ............. G02B 27/28
                                                         349/98
6,459,461 B1 * 10/2002  Umemoto ......... G02F 1/133615
                                                         349/65

(Continued)

FOREIGN PATENT DOCUMENTS

JP    2013038014 A    2/2013
JP    2015163973 A    9/2015
(Continued)

*Primary Examiner* — Ida M Soward
(74) *Attorney, Agent, or Firm* — ScienBiziP, P.C.

(57) ABSTRACT

A display device includes an active matrix substrate including a transistor element and a light-emitting element layer provided on the active matrix substrate and including a first electrode, a second electrode, a function layer including a light-emitting layer between the first electrode and the second electrode, and a sealing layer. The display device includes: a half mirror provided on a display surface side of the light-emitting element layer; and a first λ/4 plate, a reflective polarizer, and an absorbing polarizer which are provided in order from the light-emitting element layer side between the light-emitting element layer and the half mirror.

20 Claims, 10 Drawing Sheets

(51) Int. Cl.
  *H10K 50/80* (2023.01)
  *H10K 50/818* (2023.01)
  *H10K 50/84* (2023.01)
  *H10K 59/12* (2023.01)
  *H10K 59/40* (2023.01)
  *H10K 50/842* (2023.01)
  *H10K 50/844* (2023.01)
  *H10K 59/121* (2023.01)
  *H10K 59/122* (2023.01)
  *H10K 59/124* (2023.01)

(52) U.S. Cl.
  CPC ........... *H10K 50/841* (2023.02); *H10K 59/12* (2023.02); *H10K 59/40* (2023.02); *H10K 50/8426* (2023.02); *H10K 50/844* (2023.02); *H10K 59/1216* (2023.02); *H10K 59/122* (2023.02); *H10K 59/124* (2023.02)

(58) Field of Classification Search
  CPC .... H10K 50/8426; H10K 59/12; H10K 59/40; H10K 59/1216; H10K 59/122; H10K 59/124; G02B 5/3083; G02B 5/305; G02B 5/0808; G09F 9/00; G09F 9/30; H05B 33/02; H05B 33/12; H05B 33/14; H05B 33/22; H05B 33/26
  See application file for complete search history.

(56) References Cited

U.S. PATENT DOCUMENTS

| | | | | |
|---|---|---|---|---|
| 7,317,498 B2 * | 1/2008 | Hara | ................... | G02B 5/3041 349/122 |
| 2003/0127656 A1 * | 7/2003 | Aizawa | ................. | H10K 50/86 257/79 |
| 2005/0035353 A1 * | 2/2005 | Adachi | ................... | H01L 27/12 257/E27.111 |
| 2012/0055607 A1 | 3/2012 | Kitagawa et al. | | |
| 2012/0055608 A1 | 3/2012 | Kitagawa et al. | | |
| 2012/0055621 A1 | 3/2012 | Goto et al. | | |
| 2012/0055622 A1 | 3/2012 | Kitagawa et al. | | |
| 2012/0055623 A1 | 3/2012 | Kitagawa et al. | | |
| 2012/0056211 A1 | 3/2012 | Kitagawa et al. | | |
| 2012/0056340 A1 | 3/2012 | Kitagawa et al. | | |
| 2012/0057104 A1 | 3/2012 | Kitagawa et al. | | |
| 2012/0057107 A1 | 3/2012 | Kitagawa et al. | | |
| 2012/0057231 A1 | 3/2012 | Goto et al. | | |
| 2012/0057232 A1 | 3/2012 | Goto et al. | | |
| 2012/0058291 A1 | 3/2012 | Kitagawa et al. | | |
| 2012/0058321 A1 | 3/2012 | Goto et al. | | |
| 2013/0038201 A1 | 2/2013 | Fukuda | | |
| 2013/0100529 A1 | 4/2013 | Kitagawa et al. | | |
| 2013/0114139 A1 | 5/2013 | Kitagawa et al. | | |
| 2014/0186568 A1 | 7/2014 | Kitagawa et al. | | |
| 2015/0183199 A1 | 7/2015 | Kitagawa et al. | | |
| 2016/0054494 A1 | 2/2016 | Kitagawa et al. | | |
| 2016/0103258 A1 | 4/2016 | Kitagawa et al. | | |
| 2017/0082895 A1 | 3/2017 | Sakai et al. | | |
| 2017/0357112 A1 * | 12/2017 | Shibahara | ............. | G02F 1/1335 |
| 2018/0159085 A1 | 6/2018 | Yoshida | | |
| 2018/0224983 A1 | 8/2018 | Zhang et al. | | |
| 2019/0033498 A1 | 1/2019 | Tanaka et al. | | |
| 2020/0012150 A1 | 1/2020 | Watanabe et al. | | |
| 2020/0052247 A1 | 2/2020 | Yoshida | | |
| 2021/0116747 A1 * | 4/2021 | Haag | .................... | G02B 5/1814 |

FOREIGN PATENT DOCUMENTS

| | | |
|---|---|---|
| JP | 2018081138 A | 5/2018 |
| JP | 2018099811 A | 6/2018 |
| JP | 2018530032 A | 10/2018 |
| JP | 2018200355 A | 12/2018 |
| JP | 2019015808 A | 1/2019 |
| WO | 2015/141350 A1 | 9/2015 |
| WO | 2016/194801 A1 | 12/2016 |
| WO | 2017/175581 A1 | 10/2017 |
| WO | 2018/008497 A1 | 1/2018 |

* cited by examiner

DISPLAY DEVICE INCLUDING REFLECTIVE AND ABSORBING POLARIZERS

TECHNICAL FIELD

The disclosure relates to a display device including a half mirror.

BACKGROUND ART

In recent years, various display devices including a light-emitting element have been developed. Particularly, a display device including an organic light emitting diode (OLED) and a display device including an inorganic light emitting diode or a quantum dot light emitting diode (QLED) have drawn a great deal of attention because these devices offer advantages such as lower power consumption, smaller thickness, and higher image quality.

Further, in a display device including an OLED or a display device including an inorganic light emitting diode or a QLED, a display device in which a half mirror is superimposed on a light-emitting element, and mirror display is performed when the display device does not perform display has been put into practical use.

PTLs 1 and 2 disclose a display device provided with a half mirror.

CITATION LIST

Patent Literature

PTL 1: JP 2015-163973 A (published on Sep. 10, 2015)
PTL 2: JP 2018-81138 A (published on May 24, 2018)

SUMMARY

Technical Problem

However, in the case of a display device provided with a half mirror, there is a problem that most light emitted from an OLED, an inorganic light emitting diode, or a QLED, which is a light-emitting element, is reflected by the half mirror and is not taken out to the outside, and light utilization efficiency of the light-emitting element is significantly reduced.

The disclosure is contrived in view of the above-described problems, and an object thereof is to provide a high-luminance display device with improved light utilization efficiency even when a half mirror is installed.

Solution to Problem

To solve the above problems, a display device of the disclosure is a display device including an active matrix substrate including a transistor element, and a light-emitting element layer provided on the active matrix substrate and including a first electrode, a second electrode, a function layer including a light-emitting layer between the first electrode and the second electrode, and a sealing layer, the display device including a half mirror provided on a display surface side of the light-emitting element layer, and a first λ/4 plate, a reflective polarizer, and an absorbing polarizer which are provided in order from the light-emitting element layer side between the light-emitting element layer and the half mirror.

To solve the above problems, a display device according to another aspect of the disclosure is a display device including an active matrix substrate including a transistor element, and a light-emitting element layer provided on the active matrix substrate and including a first electrode, a second electrode, a function layer including a light-emitting layer between the first electrode and the second electrode, and a sealing layer, the display device including a half mirror provided on a display surface side of the light-emitting element layer, and a first λ/4 plate, a first reflective polarizer, a second reflective polarizer, and a second λ/4 plate which are provided in order from the light-emitting element layer side between the light-emitting element layer and the half mirror.

Advantageous Effects of Disclosure-Invention

It is possible to provide a high-luminance display device with improved light utilization efficiency even when a half mirror is installed.

DESCRIPTION OF EMBODIMENTS

Figure 1:
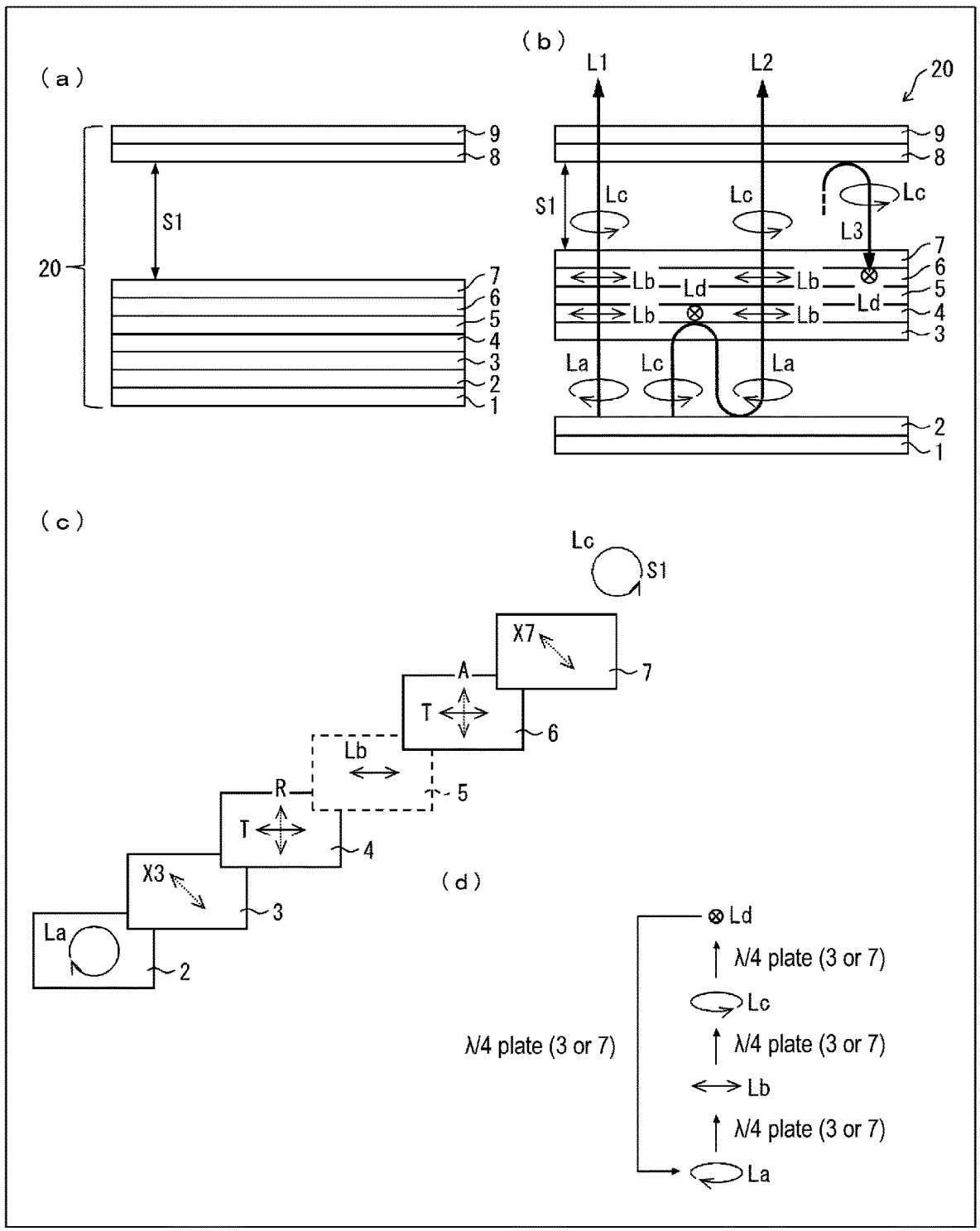
FIG. 1(a) is a diagram illustrating a schematic configuration of a display device according to a first embodiment.
FIGS. 1(b) to 1(d) are diagrams illustrating polarization, reflection, and absorption characteristics of light in the display device according to the first embodiment.

Embodiments of the disclosure will be described below with reference to FIGS. 1 to 10. Hereinafter, for convenience of description, components having the same functions as those described in a specific embodiment are denoted by the same reference numerals, and descriptions thereof may be omitted.

First Embodiment (a) of FIG. 1 is a diagram illustrating a schematic configuration of a display device 20 according to a first embodiment, and (b) to (d) of FIG. 1 are diagrams illustrating polarization, reflection, and absorption characteristics of light in the display device 20 according to the first embodiment.

As illustrated in (a) of FIG. 1, the display device 20 includes an active matrix substrate 1 having transistor elements (transistors) Tr to be described below in pixel units, a tight-emitting element layer 2 provided on the active matrix substrate 1, and a half mirror 8 and a protective cover 9 which constitute a hood. Furthermore, a first λ/4 plate 3, a reflective polarizer (also referred to as a Dual Brightness Enhancement Film (DBEF)) 4, a diffusion layer (diffusion sheet) 5, an absorbing polarizer (linear polarizer) 6, and a second λ/4 plate 7 are provided in that order from the light-emitting element layer 2 side between the tight-emitting element layer 2 and the half mirror 8. In addition, a space (air layer) S1 of, for example, approximately 10 mm is provided between the second λ/4 plate 7 and the hood, that is, between the second λ/4 plate 7 and the half mirror 8.

In the present embodiment, a case where the space (air layer) S1 is provided between the second λ/4 plate 7 and the half mirror 8 will be described as an example, but the embodiment is not limited thereto. The space (air layer) S1 may be provided at at least one location among a location between the reflective polarizer 4 and the half mirror 8, specifically a location between the reflective polarizer 4 and the diffusion layer 5, a location between the diffusion layer 5 and the absorbing polarizer 6, a location between the absorbing polarizer 6 and the second λ/4 plate 7, and a location between the second λ/4 plate 7 and the half mirror 8. Furthermore, the space (air layer) S1 may not be provided in any of the above-described locations.

Note that the space (air layer) S1 is not provided between the light-emitting element layer 2 and the first λ/4 plate 3, and the light-emitting element layer 2 and the first λ/4 plate 3 abut on each other. Similarly, neither is the space (air layer) S1 provided between the first λ/4 plate 3 and the reflective polarizer 4, and the first λ/4 plate 3 and the reflective polarizer 4 abut on each other.

Although not illustrated in (a) of FIG. 1, for example, an optical clear adhesive (OCA) or an optical clear resin (OCR) may be formed over the entire surface as an adhesive layer between the light-emitting element layer 2 and the first λ/4 plate 3, between the first λ/4 plate 3 and the reflective polarizer 4, between the reflective polarizer 4 and the diffusion layer 5, between the diffusion layer 5 and the absorbing polarizer 6, and between the absorbing polarizer 6 and the second λ/4 plate 7, where the space (air layer) S1 is not provided, and the layers may be bonded to each other.

On the other hand, for example, the adhesive layer may be formed in a frame shape at an end portion between the second λ/4 plate 7 and the half mirror 8 where the space (air layer) S1 is provided. In this case, the second λ/4 plate 7 and the half mirror 8 can be bonded to each other, and a portion where the adhesive layer is not formed is the space (air layer) S1.

In the present embodiment, description will be given of an example of a case where, as illustrated in (c) of FIG. 1, a transmission axis T of the reflective polarizer 4 and a reflection axis R of the reflective polarizer 4 are orthogonal to each other (form an angle of 90 degrees), an angle formed by a slow axis X3 of the first λ/4 plate 3 and a slow axis X7 of the second λ/4 plate 7 is 0 degrees, an angle formed by the slow axis X3 of the first λ/4 plate 3 and the transmission axis T of the reflective polarizer 4, an angle formed by the slow axis X3 of the first λ/4 plate 3 and the reflection axis R of the reflective polarizer 4, an angle formed by the slow axis X7 of the second λ/4 plate 7 and the transmission axis T of the reflective polarizer 4, and an angle formed by the slow axis X7 of the second λ/4 plate 7 and the reflection axis R of the reflective polarizer 4 are 45 degrees, and an angle formed by the transmission axis T of the reflective polarizer 4 and a transmission axis T of the absorbing polarizer 6 and an angle formed by the reflection axis R of the reflective polarizer 4 and an absorption axis A of the absorbing polarizer 6 are 0 degrees, but the embodiment is not limited thereto. For example, there are effects such as variations in the accuracy of design of the first λ/4 plate 3, the reflective polarizer 4, the absorbing polarizer 6, and the second λ/4 plate 7 and variations in the accuracy of disposition of these members, and thus the above-described angles such as 90 degrees, 45 degrees, and 0 degrees are not exact angles and include variations within a range of, for example, +5 degrees to −5 degrees.

Note that, in the present embodiment, an example of a case where the diffusion layer 5 is provided to increase a viewing angle of the display device 20 will be described. However, the embodiment is not limited thereto, and a front transmittance of the diffusion layer 5 is approximately 85%, and thus it is preferable to omit the diffusion layer 5 in a case where it is not necessary to increase a viewing angle in the display device 20, or the like. For this reason, the diffusion layer 5 is indicated by a dashed line in (c) of FIG. 1. Note that the diffusion layer 5 is provided in a layer above the light-emitting element layer 2, and thus a viewing angle can be increased. However, in order to obtain a maximum effect of improving light utilization efficiency, it is desirable to provide the diffusion layer 5 in a layer above the reflective polarizer 4, and the diffusion layer 5 is provided on the reflective polarizer 4 in the present embodiment. Further, in (c) of FIG. 1, only a left-handed circularly polarized component La, out of the left-handed. circularly polarized component La and a right-handed circularly polarized component Lc emitted from the light-emitting element layer 2, is illustrated as an example.

As illustrated in (d) of FIG. 1, when the left-handed circularly polarized component La passes through the first λ/4 plate 3 having the slow axis X3 and the second λ/4 plate 7 having the slow axis X7, the left-handed circularly polarized component La becomes a polarized component Lb in the direction of the transmission axis T of the reflective polarizer 4. When the polarized component Lb in the direction of the transmission axis T of the reflective polarizer 4 passes through the first λ/4 plate 3 having the slow axis X3 or the second λ/4 plate 7 having the slow axis X7, the polarized component Lb becomes the right-handed circularly polarized component Lc. When the right-handed circularly polarized component Lc passes through the first λ/4 plate 3 having the slow axis X3 or the second λ/4 plate 7 having the slow axis X7, the right-handed circularly polarized component Lc becomes a polarized component Ld in the direction of the reflection axis R of the reflective polarizer 4 and the direction of the absorption axis A of the absorbing polarizer 6. When the polarized component Ld passes through the first λ/4 plate 3 having the slow axis X3 or the second λ/4 plate 7 having the slow axis X7, the polarized component Ld becomes the left-handed circularly polarized component La.

As illustrated in (b) of FIG. 1, unpolarized light including the left-handed circularly polarized component La and the right-handed circularly polarized component Lc is emitted from the light-emitting element layer 2. Among them, the left-handed circularly polarized component La is not reflected and becomes a light component L1 that passes through the hood. On the other hand, the right-handed circularly polarized component Lc is first reflected by the reflective polarizer 4, and is then reflected again by the light-emitting element layer 2 or a metal layer included in the active matrix substrate 1, which will be described later in detail, and then the right-handed circularly polarized component Lc becomes a light component L2 that passes through the hood. As described above, in the display device 20 of the present embodiment, both the left-handed circularly polarized component La and the right-handed circularly polarized component Lc emitted from the light-emitting element layer 2 can be used, and thus it is possible to realize high utilization efficiency of light emitted from the light-emitting element layer 2.

The light component L1 or the light component L2 that passes through the hood is a light component in which a portion of the light component has been reflected by the half mirror 8. A light component L3 reflected by the half mirror 8 in this manner is a light component that may cause a double projection of a video. However, in the display device 20 of the present embodiment, the light component L3 reflected by the half mirror 8 is absorbed by the absorbing polarizer 6, and thus it is possible to suppress a double projection of a video.

Figure 2:
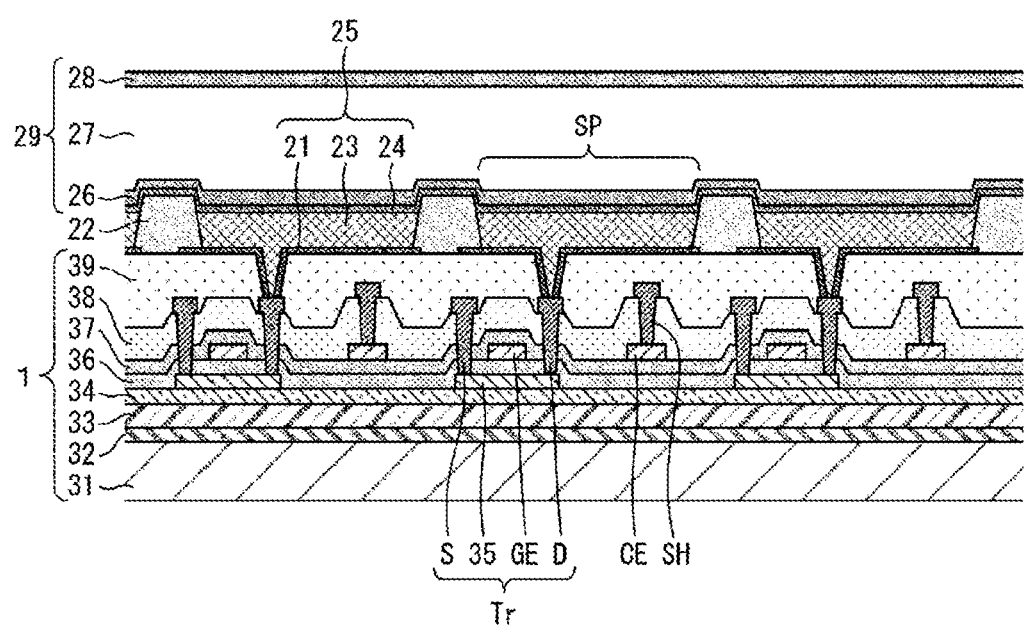
FIG. 2 is a diagram illustrating schematic configurations of a light-emitting element layer and an active matrix substrate that are included in the display device according to the first embodiment.

FIG. 2 is a diagram illustrating schematic configurations of the active matrix substrate 1 and the light-emitting element layer 2 that are included in the display device 20 according to the first embodiment.

As illustrated in FIG. 2, the light-emitting element layer 2 illustrated in FIG. 1 includes a first electrode 21, a second electrode 24, a function layer 23 including a light-emitting layer between the first electrode 21 and the second electrode 24, and a sealing layer 29.

In the active matrix substrate 1, a base substrate 31 is attached to a lower surface of a resin layer 33 via an adhesive layer 32. On the other hand, a barrier layer (base coat film) 34 which is an inorganic film, a transistor element Tr, and a capacitive element are formed on the lower surface of the resin layer 33.

In the present embodiment, description will be given of an example of a case where the display device 20 is made flexible by forming the resin layer 33, the barrier layer (base coat film) 34 which is an inorganic film, the transistor element Tr, the capacitive element, a light-emitting element 25, and the sealing layer 29 on a glass substrate (not illustrated) having high heat resistance, irradiating the resin layer 33 with a laser beam via the glass substrate (not illustrated) having high heat resistance, peeling the glass substrate (not illustrated) having high heat resistance off the resin layer 33, and then attaching the base substrate 31 which is a flexible substrate to a surface from which the glass substrate (not illustrated) having high heat resistance is peeled off the resin layer 33 via the adhesive layer 32, but the embodiment is not limited thereto. For example, in the above-described process, a step of attaching the base substrate 31, which is a flexible substrate, via the adhesive layer 32 may be omitted, and the display device 20 may be made flexible by using the resin layer 33 as a flexible substrate as it is, Note that a method of making the display device 20 flexible is not limited to the above-described method.

Further, in the present embodiment, as described above, a case where the display device 20 is made flexible has been described as an example, but the embodiment is not limited thereto. The display device 20 may be a non-flexible display device, and in this case, for example, a display device in which the barrier layer (base coat film) 34, which is an inorganic film, the transistor element Tr, and the capacitive element, the light-emitting element 25, and the sealing layer 29 are formed on the glass substrate (not illustrated) having high heat resistance may be used.

Examples of the material of the base substrate 31 may include polyethylene terephthalate (PET) and the like, but the material is not limited thereto.

Examples of the adhesive layer 32 may include an optical clear adhesive (OCA) or an optical clear resin (OCR), but are not limited thereto.

Examples of the material of the resin layer 33 may include a polyimide resin, an epoxy resin, a polyamide resin, and the like, but are not limited thereto.

The barrier layer 34 is a layer for preventing moisture or impurities from reaching the transistor element Tr, and the light-emitting element 25, and may be constituted by, for example, a silicon oxide film, a silicon nitride film or a silicon oxynitride film, or a layered film of these films that is formed using CVD.

The transistor element Tr and the capacitive element are provided on upper layers of the resin layer 33 and the barrier layer 34. An element forming layer including the transistor element Tr and the capacitive element includes a semiconductor film 35, an inorganic insulating film (gate insulating film) 36 as a layer above the semiconductor film 35, a gate electrode GE as a layer above the inorganic insulating film 36, an inorganic insulating film (first insulating film) 37 as a layer above the gate electrode GE, a counter electrode CE of the capacitive element as a layer above the inorganic insulating film 37, an inorganic insulating film (second insulating film) 38 as a layer above the counter electrode CE of the capacitive element, a source electrode S, a drain electrode D, and a wiring line SH as layers above the inorganic insulating film 38, and an interlayer insulating film 39 as a layer above the source electrode S, the drain electrode D, and the wiring line SH.

Note that the capacitive element includes the counter electrode CE of the capacitive element formed directly above the inorganic insulating film 37, the inorganic insulating film 37, and a capacitance electrode formed directly above the inorganic insulating film 37 and formed to be superimposed on the counter electrode CE of the capacitive element in the same layer as the layer in which the gate electrode GE is formed.

A transistor element (thin film transistor element (TFT)) Tr is configured as an active element to include the semiconductor film 35, the inorganic insulating film 36, the gate electrode GE, the inorganic insulating film 37, the inorganic insulating film 38, the source electrode S, and the drain electrode D.

The semiconductor film 35 may be constituted by, for example, low-temperature polysilicon (LIPS) or an oxide semiconductor.

The gate electrode GE, the counter electrode CE of the capacitive element, the source electrode S, the drain electrode D, and the wiring line SH may be constituted by, for example, a single-layer film or a layered film of a metal containing at least one of aluminum (Al), tungsten (W), molybdenum (Mo), tantalum (Ta), chromium (Cr), titanium (Ti), copper (Cu), and silver (Ag).

The inorganic insulating films 36, 37, and 38 may be constituted by, for example, a silicon oxide (SiOx) film, a silicon nitride (SiNx) film, or a silicon oxynitride film, or a layered film of these films formed by a CVD method.

The interlayer insulating film 39 may be formed of, for example, a coatable photosensitive organic material, such as a polyimide resin, an acrylic resin, or the like.

The light-emitting element 25 includes the first electrode 21 as a layer above the interlayer insulating film 39, a function layer 23 including a light-emitting layer as a layer above the first electrode 21, and the second electrode 24 as a layer above the function layer 23 including a light-emitting layer. An edge cover (bank) 22 covering the edge of the first electrode 21 is formed on the active matrix substrate 1. That is, an end portion which is a portion of the first electrode 21 is superimposed on the edge cover 22. Note that the size of the first electrode 21 is greater than the size of the light-emitting layer in the function layer 23, a first region of the first electrode 21 is a region superimposed on the light-emitting layer, and a second region of the first electrode 21 is a region other than the region superimposed on the light-emitting layer. In addition, the reflectance of the light-emitting element layer 2 in which the second region of the first electrode 21 is included in the display device 20 is mainly determined, and the light-emitting element layer 2 having a reflectance of 50% is used in the present embodiment.

The first electrode 21 having an island shape, the function layer 23 including the light-emitting layer, and the second electrode 24 are included for each subpixel SP of the display device 20. The edge cover 22 may be formed of, for example, a coatable photosensitive organic material such as a polyimide resin or an acrylic resin.

The function layer 23 including the light-emitting layer is constituted by laminating, for example, a hole injection layer, a hole transport layer, a light-emitting layer, an electron transport layer, and an electron injection layer in that order from the lower layer side. The light-emitting layer is formed in an island shape for each subpixel by a vapor deposition method or an ink-jet method, but the other layers can also be configured as solid common layers. In addition, it is also possible to adopt a configuration in which one or more layers among the hole injection layer, the hole transport layer, the electron transport layer, and the electron injection layer are not formed.

The first electrode 21 can be configured, for example, by laminating indium Tin Oxide (ITO) and an alloy containing Ag, but is not particularly limited as long as conductivity and light reflectivity can be secured. In addition, the second electrode 24 can be formed of a light-transmitting conductive material such as Indium Tin Oxide (ITO) or Indium Zinc Oxide (IZO), but is not particularly limited as long as conductivity and light transmittance can be secured.

The first electrode 21 formed on the active matrix substrate 1 is provided for each subpixel (pixel) SP, and is electrically connected to the drain electrode D of the transistor element Tr. In addition, the second electrode 24 is provided in common with all of the subpixels (pixels) SP. Note that the transistor element Tr provided for each subpixel (pixel) SP can be driven for each subpixel.

In the present embodiment, description has been given of an example of a case where the light-emitting element 25 is a top emission type in which light emitted from the light-emitting layer of the function layer 23 is emitted from the second electrode 24 side because the second electrode 24 is a light-transmissive electrode and the first electrode 21 is a light reflective electrode, and a hood including the half mirror 8 is provided on a display surface side of the light-emitting layer in the display device 20, that is, on a side above the sealing layer 29 in FIG. 2, but the embodiment is not limited thereto. For example, the light-emitting element 25 may be a bottom emission type in which the second electrode 24 is a light reflective electrode, the first electrode 21 is a light transmissive electrode, and light emitted from the light-emitting layer of the function layer 23 is emitted from the first electrode 21 side. In this case, a hood including the half mirror 8 is provided on the display surface side of the light-emitting layer in the display device 20, that is, on a side below the base substrate 31 in FIG. 2. Note that the display surface of the light-emitting layer included in the function layer 23 is a surface of the display device 20 in which light from the light-emitting layer is emitted mainly.

The light-emitting element 25 may be an Organic Light Emitting Diode (OLED), an inorganic light emitting diode, and a Quantum dot Light Emitting Diode (QLED).

The sealing layer 29 is a light transmissive layer, and includes a first inorganic sealing film 26 that covers the second electrode 24, an organic sealing film 27 that is formed on a side above the first inorganic sealing film 26, and a second inorganic sealing film 28 that covers the organic sealing film 27. The sealing layer 29 that covers the light-emitting element 25 prevents foreign matters such as water or oxygen from infiltrating into the light-emitting element 25.

Each of the first inorganic sealing film 26 and the second inorganic sealing film 28 may be constituted by, for example, a silicon oxide film, a silicon nitride film, or a silicon oxynitride film, or a layered film of these films formed by CVD. The organic sealing film 27 is a light transmissive organic film which is thicker than the first inorganic sealing film 26 and the second inorganic sealing film 28, and can be formed of a coatable photosensitive organic material such as a polyimide resin or an acrylic resin.

In the present embodiment, the sealing layer 29 constituted by a single-layered organic film and a two-layered inorganic film and including the organic sealing film 27 between the first inorganic sealing film 26 and the second inorganic sealing film 28 has been described as an example, but the embodiment is not limited thereto. The sealing layer 29 may be formed of only an inorganic film constituted by one or more layers or an organic film constituted by one or more layers, or may be formed of an inorganic film constituted by two or more layers or an organic film constituted by two or more layers.

In the present embodiment, the protective cover 9 constituting the hood is formed of a polycarbonate resin, but the embodiment is not limited thereto. The protective cover 9 may be formed of glass, an acrylic resin, or the like. Furthermore, in the present embodiment, the half mirror 8 (for example, a transmittance of approximately 30% and a reflectance of 50%) constituting the hood is formed by performing metal vapor deposition on the protective cover 9.

Further, in the present embodiment, a diffusion layer having a front transmittance of, for example, approximately 85% is used as the diffusion layer 5, and an absorbing polarizer having, for example, a transmittance of approximately 42% is used as the absorbing polarizer 6.

In the case of a display device including a half mirror, for example, a circular polarizer may be provided in order to suppress a double projection of a video due to reflection between the half mirror and the light-emitting element provided in the display device. In such a case, there is a problem in that light utilization efficiency of the light-emitting element is reduced. Hereinafter, a display device 100 according to a first comparative example illustrated in FIG. 10 will be described as an example in detail.

Figure 10:
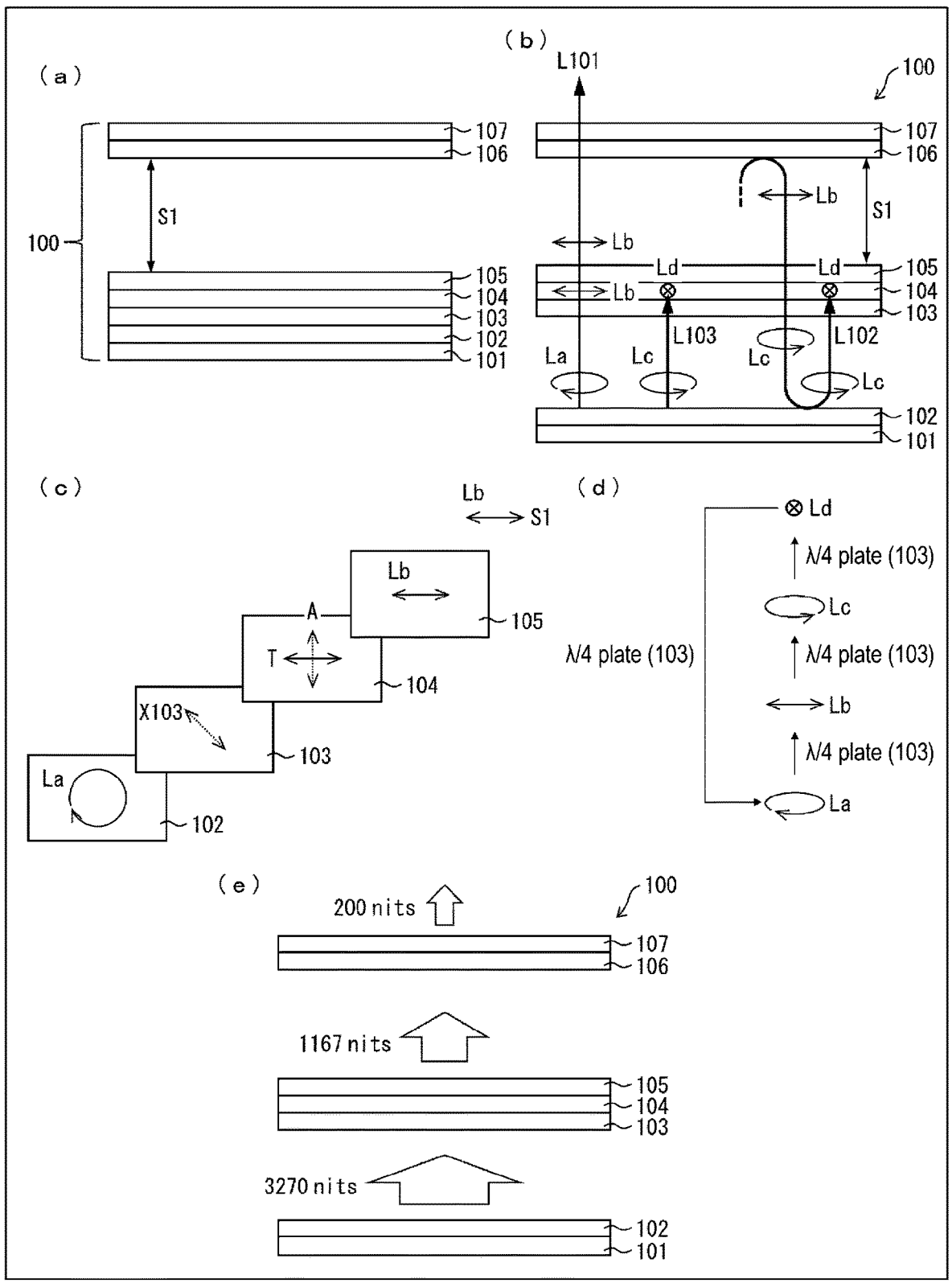
FIGS. 10(a) to 10(e) are diagrams illustrating a problem of a display device according to a first comparative example which includes a half mirror and a circular polarizer.

(a) to (e) of FIG. 10 are diagrams illustrating a problem of the display device 100 according to the first comparative example which includes a half mirror 106 and a circular polarizer.

As illustrated in (a) of IF1G. 10, the display device 100 includes an active matrix substrate 101 provided with a light-emitting element layer 102, and a half mirror 106 and a protective cover 107 that constitute a hood. In addition, a $\lambda/4$ plate 103, an absorbing polarizer (linear polarizer) 104, and a diffusion layer 105 are provided in that order from the light-emitting element layer 102 side between the light-emitting element layer 102 and the half mirror 106. In addition, a space (air layer) S1 of approximately 10 mm is provided between the diffusion layer 105 and the hood, that is, between the diffusion layer 105 and the half mirror 106.

As illustrated in (c) of FIG. 10, the $\lambda/4$ plate 103 and the absorbing polarizer (linear polarizer) 104 that constitute the circular polarizer are provided such that an angle formed by a slow axis X103 of the $\lambda/4$ plate 103 and a transmission axis T and an absorption axis A of the absorbing polarizer 104 is 45 degrees.

As illustrated in (d) of FIG. 10, when the left-handed circularly polarized component La passes through a $\lambda/4$ plate 103 having the slow axis X103, the left-handed circularly polarized component La becomes a polarized component Lb in the direction of the transmission axis T of the absorbing polarizer 104. When the polarized component Lb in the direction of the transmission axis T of the absorbing polarizer 104 passes through the $\lambda/4$ plate 103 having the slow axis X103, the polarized component Lb becomes the right-handed circularly polarized component Lc. When the right-handed circularly polarized component Lc passes through the $\lambda/4$ plate 103 having the slow axis X103, the right-handed circularly polarized component Lc becomes the polarized component Ld in the direction of the absorption axis A of the absorbing polarizer 104. When the polarized component Ld in the direction of the absorption axis A of the absorbing polarizer 104 passes through the $\lambda/4$ plate 103 having the slow axis X103, the polarized component Ld becomes the left-handed circularly polarized component La.

As illustrated in (b) of FIG. 10, unpolarized light including the left-handed circularly polarized component La and the right-handed circularly polarized component Lc is emitted from the light-emitting element layer 102. Among them, the left-handed circularly polarized component La is not absorbed and becomes a light component L101 that passes through the hood. On the other hand, the right-handed circularly polarized component Lc becomes the light component L103 absorbed by the absorbing polarizer 104. Thus, substantially half of light emitted from the light-emitting element layer 102 is absorbed in the process of passing through the absorbing polarizer 104.

In addition, a portion of the left-handed circularly polarized component La emitted from the light-emitting element layer 102 becomes a light component L102 that causes a double projection of a video due to reflection between the half mirror 106 and a metal layer included in the light-emitting element layer 102 or the active matrix substrate 101. However, in the display device 100, the $\lambda/4$ plate 103 and the absorbing polarizer 104 that constitute the circular polarizer are provided, and thus the light component L102 is absorbed by the absorbing polarizer 104.

As described above, in the display device 100, a double projection of a video can be suppressed by including the $\lambda/4$ plate 103 and the absorbing polarizer 104 that constitute the circular polarizer. However, there is the light component L103 absorbed by the absorbing polarizer 104, and thus there is a problem in that the utilization efficiency of light emitted from the light-emitting element layer 102 cannot be improved to a satisfactory level.

Furthermore, regarding the transmittance of each member provided in the display device 100, it is necessary to generate a luminance of 3270 nits by a single body of the light-emitting element layer 102 in order to realize the display device 100 of a luminance of 200 nits as illustrated in (e) of FIG. 10, in consideration of, for example, the absorbing polarizer 104 (a transmittance of approximately 42%), the diffusion layer 105 (a front transmittance of approximately 85%), and the half mirror 106 formed in the protective cover 107 (a transmittance of approximately 30% and a reflectance of 50%).

Thus, in the case of the display device 100, in order to generate a certain desired luminance, it is necessary to significantly increase the emission luminance of the light-emitting element, and it is difficult to secure the lifespan of the display device.

In the display device 100 according to the first comparative example described above, the protective cover 107 is the same as the protective cover 9 constituting the hood in the present embodiment, the half mirror 106 is the same as the half mirror 8 (for example, a transmittance of approximately 30% and a reflectance of 50%) constituting the hood in the present embodiment, the $\lambda/4$ plate 103 is the same as the first $\lambda/4$ plate 3 in the present embodiment, the diffusion layer 105 is the same as the diffusion layer 5 (for example, a front transmittance of approximately 85%) in the present embodiment, and the absorbing polarizer 104 is the same as the absorbing polarizer 6 (for example, a transmittance of approximately 42%) in the present embodiment. Note that the active matrix substrate 101 and the light-emitting element layer 102 in the display device 100 according to the first comparative example are different from the active matrix substrate 1 and the tight-emitting element layer 2 illustrated in FIGS. 1 and 2.

Consequently, in the display device 20 according to the present embodiment, in order to confirm how efficiently the utilization of light emitted from the light-emitting element layer 2 can be realized, a display device according to a second comparative example having the following configuration is manufactured, and a front luminance of the display surface of the display device 20 and a front luminance of the display surface of the display device according to the second comparative example are compared with each other.

The display device according to the second comparative example is configured such that the first electrode 21, the second electrode 24, the function layer 23 including a light-emitting layer between the first electrode 21 and the second electrode 24, and the sealing layer 29 are formed on the active matrix substrate 1 illustrated in FIG. 2 as the light-emitting element layer 2, and the λ/4 plate 103, the absorbing polarizer 104, the diffusion layer 105, the space (air layer) S1 of, for example, approximately 10 mm, the half mirror 106, and the protective cover 107 are provided in that order on the upper side of the sealing layer 29. In other words, the display device according to the second comparative example includes active matrix substrate 1 and the light-emitting element layer 2 in the same manner as the display device 20 according to the present embodiment. On the other hand, the λ/4 plate 103, the absorbing polarizer (linear polarizer) 104, the diffusion layer 105, the half mirror 106, and the protective cover 107, which are included in the display device 100 according to the first comparative example, are provided on the upper side of the sealing layer 29 of the light-emitting element layer 2.

As a result of comparison between a front luminance of the display surface of the display device 20 and a front luminance of the display surface of the display device according to the second comparative example with respect to the same gray scale signal, it was confirmed that the front luminance of the display surface of the display device 20 was 1.45 times higher than the front luminance of the display surface of the display device according to the second comparative example.

This is because the right-handed circularly polarized component Lc from the light-emitting element layer 2 which is absorbed by the absorbing polarizer 104 in the display device according to the second comparative example is reflected by the reflective polarizer 4 (for example, a reflectance of 90%) as illustrated in (b) of FIG. 1, is reflected again by the light-emitting element layer 2 or the metal layer included in the active matrix substrate 1, and then becomes the light component L2 that passes through the hood in the display device 20 according to the present embodiment.

Figure 3:
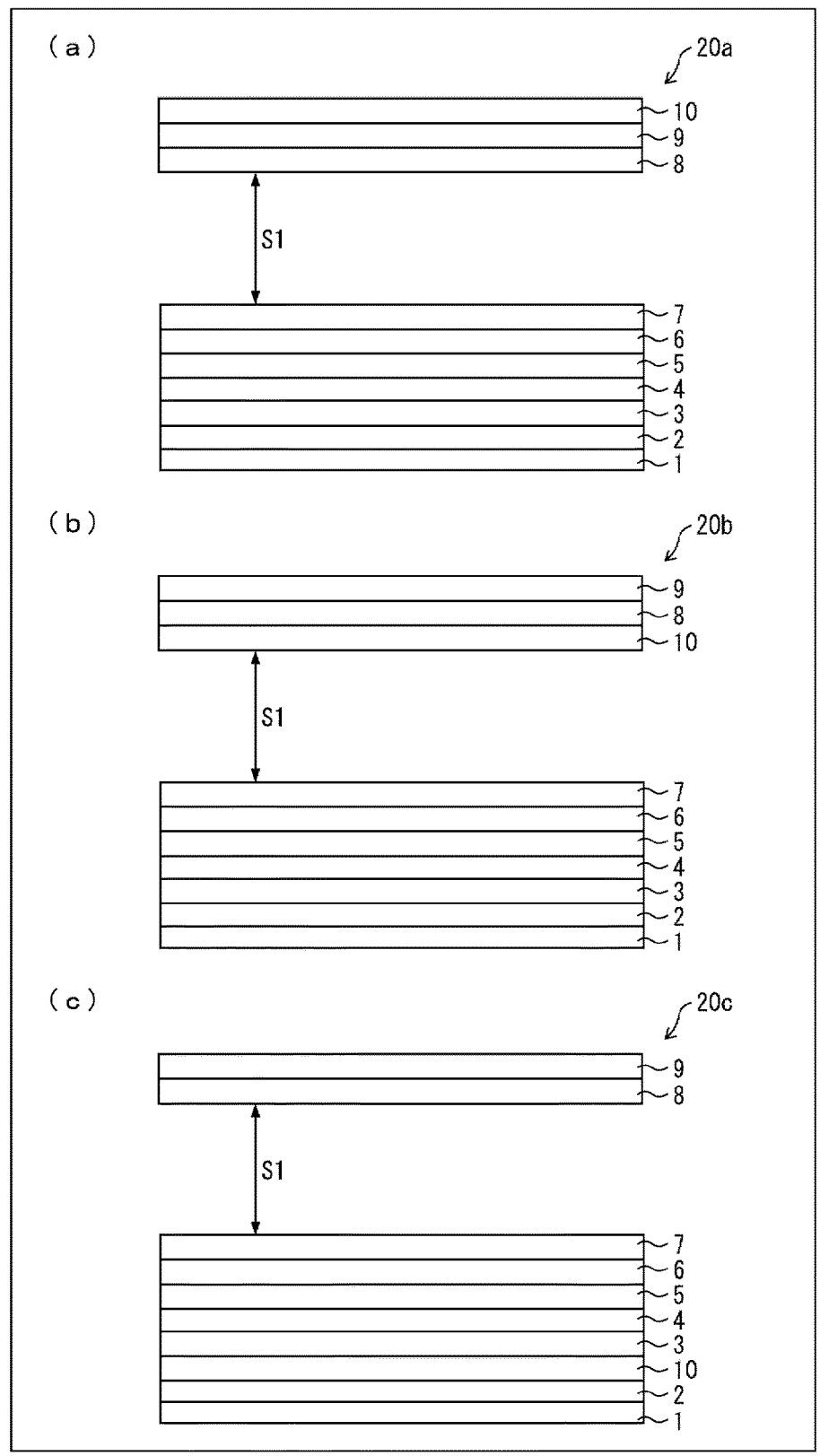
FIGS. 3(a) to 3(c) are diagrams illustrating an example of a case where the display device according to the first embodiment includes a touch panel.

(a) to (c) of FIG. 3 are diagrams illustrating examples of display devices 20a, 20b, and 20c including a touch panel 10.

In the display device 20a illustrated in (a) of FIG. 3, the touch panel 10 is provided on the surface of the protective cover 9 on a side opposite to the light-emitting element layer 2 side.

In the display device 20b illustrated in (b) of FIG. 3, the touch panel 10 is provided on the surface of the half mirror 8 on the light-emitting element layer 2 side.

In the display device 20c illustrated in (c) of FIG. 3, the touch panel 10 is provided between the light-emitting element layer 2 and the first λ/4 plate 3.

Note that the formation position of the touch panel 10 illustrated in (a) to (c) of FIG. 3 is an example of a preferred disposition position of the touch panel 10, and thus the disposition position of the touch panel 10 is not limited thereto.

Second Embodiment

Next, a second embodiment of the disclosure will be described below with reference to FIGS. 4 and 5. A display device 30 according to the present embodiment differs from that in the first embodiment in that a diffusion layer 5 is omitted to realize higher utilization efficiency of light, and an anti-reflection layer 13 is provided on the half mirror 8 side of the second λ/4 plate 7, and a light-emitting element layer 12 having a high reflectance is used, and the other configurations are as described in the first embodiment. For convenience of description, members having the same functions as those of the members illustrated in the drawings in the first embodiment are denoted by the same reference numerals, and descriptions thereof will be omitted.

Figure 4:
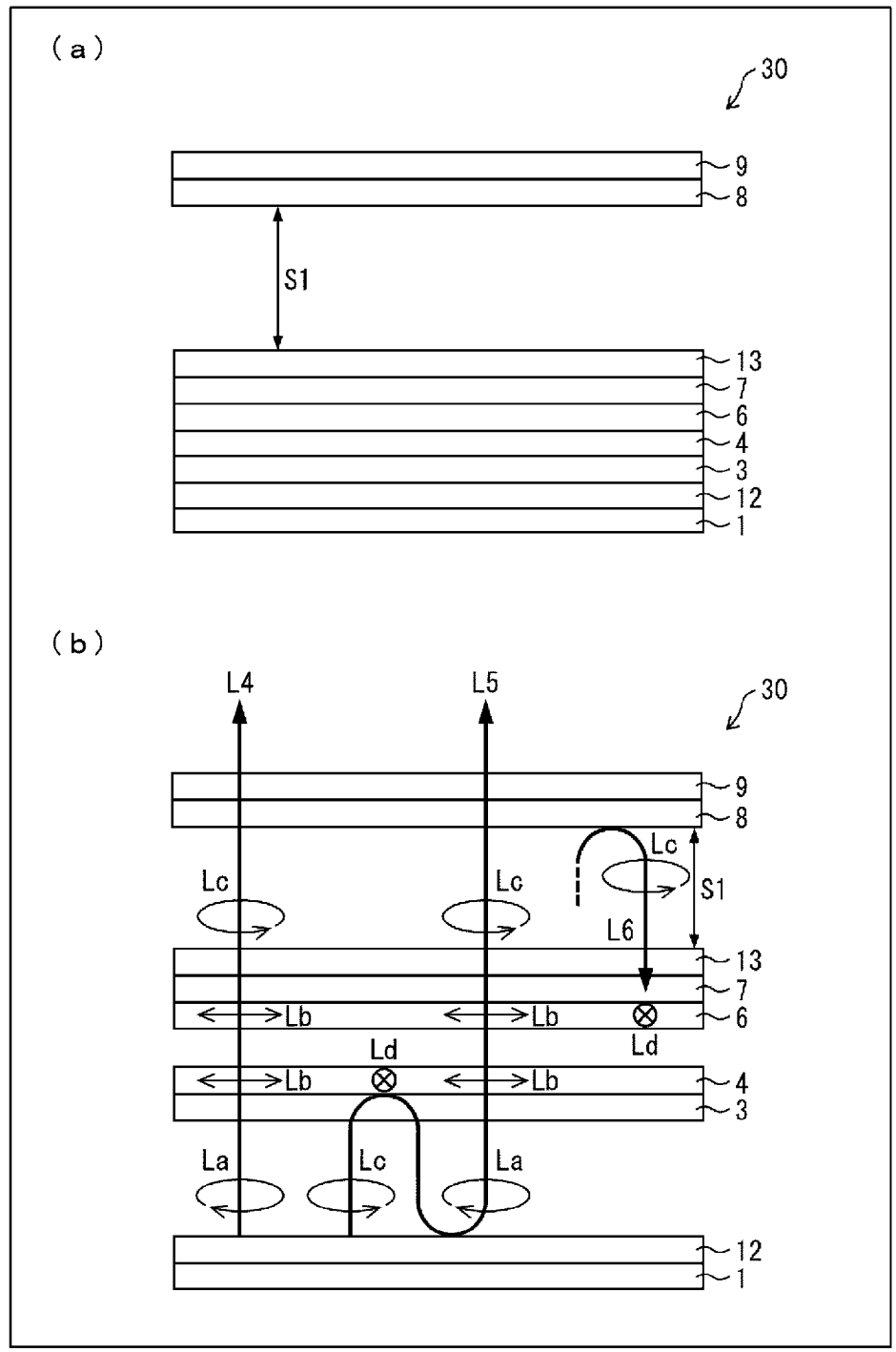
FIG. 4(a) is a diagram illustrating a schematic configuration of a display device according to a second embodiment.
FIG. 4(b) is a diagram illustrating polarization, reflection, and absorption characteristics of light in the display device according to the second embodiment.

(a) of FIG. 4 is a diagram illustrating a schematic configuration of the display device 30 according to the second embodiment, and (b) of FIG. 4 is a diagram illustrating polarization, reflection, and absorption characteristics of light in the display device 30 according to the second embodiment.

As illustrated in (a) of FIG. 4, the display device 30 includes an active matrix substrate 1 provided with the light-emitting element layer 12, and the half mirror 8 and a protective cover 9 that constitute a hood. Furthermore, a first λ/4 plate 3, a reflective polarizer 4, an absorbing polarizer 6, the second λ/4 plate 7, and the anti-reflection layer 13 (also referred to as an anti-reflection (AR) sheet) are provided in that order from the light-emitting element layer 12 side between the light-emitting element layer 12 and the half mirror 8. In addition, a space (air layer) S1 of, for example, approximately 10 mm is provided between the anti-reflection layer 13 and the hood, that is, between the anti-reflection layer 13 and the half mirror 8.

In the present embodiment, a case where the space (air layer) S1 is provided between the anti-reflection layer 13 and the half mirror 8 will be described as an example, but the embodiment is not limited thereto. In a case where the space (air layer) S1 is provided, the space may be provided between the reflective polarizer 4 and the half mirror 8. Furthermore, the space (air layer) S1 may not be provided.

Note that the space (air layer) S1 is not provided between the light-emitting element layer 12 and the first λ/4 plate 3, and the light-emitting element layer 12 and the first λ/4 plate 3 abut on each other.

Although not illustrated in (a) of FIG. 4, for example, an OCA or an OCR may be formed on the entire surface as an adhesive layer between the second λ/4 plate 7 and the anti-reflection layer 13 in which the space (air layer) S1 is not provided, and the layers may be bonded to each other.

On the other hand, the adhesive layer may be formed in a frame shape at an end portion between the anti-reflection layer 13 and the half mirror 8 in which the space (air layer) S1 is provided, and in this case, the anti-reflection layer 13 and the half mirror 8 can be bonded to each other, and a portion where the adhesive layer is not formed is a space (air layer) S1.

As illustrated in (b) of FIG. 4, unpolarized light including a left-handed circularly polarized component La and a right-handed circularly polarized component Lc is emitted from the light-emitting element layer 12. Among them, the left-handed circularly polarized component La is not reflected and becomes a light component L4 that passes through the hood. On the other hand, the right-handed circularly polarized component Lc is first reflected by the reflective polarizer 4, and is then reflected again by the light-emitting element layer 12 or a metal layer included in the active matrix substrate 1, and then the right-handed circularly polarized component Lc becomes a light component L5 that passes through the hood. As described above, in the display device 30 of the present embodiment, both the left-handed circularly polarized component La and the right-handed circularly polarized component Lc emitted from the light-emitting element layer 12 can be utilized, and thus it is possible to realize high utilization efficiency of light emitted from the light-emitting element layer 12.

The light component L4 or the light component L5 that passes through the hood is a light component in which a portion of the light component has been reflected by the half mirror 8. A light component L6 reflected by the half mirror 8 in this manner is a light component that may cause a double projection of a video. However, in the display device 30 of the present embodiment, the light component L6 reflected by the half mirror 8 is absorbed by the absorbing polarizer 6, and thus it is possible to suppress a double projection of a video.

Figure 5:
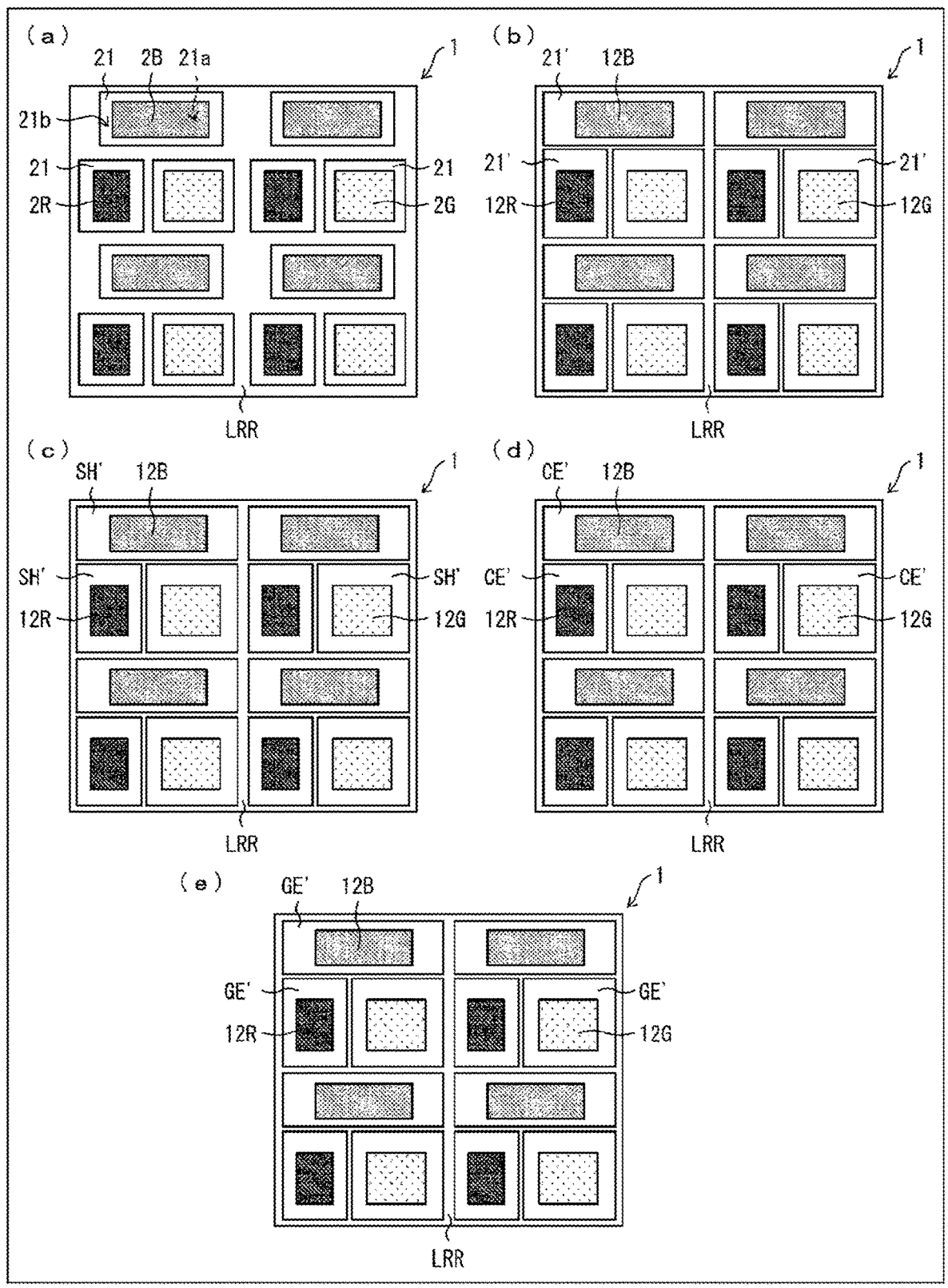
FIG. 5(a) is a diagram illustrating a first electrode, light-emitting layers of colors, and a region having a low reflectance which are formed on an active matrix substrate in the display device according to the first embodiment.
FIG. 5(b) is a diagram illustrating a reflective metal layer which is a layer different from a first electrode, light-emitting layers of colors, and a region having a low reflectance which are formed on an active matrix substrate in the display device according to the second embodiment.
FIG. 5(c) is a diagram illustrating a case where a reflective metal layer is formed of the same material in the same layer as a source electrode and a drain electrode of a transistor element included in an active matrix substrate.
FIG. 5(d) is a diagram illustrating a case where a reflective metal layer is formed of the same material in the same layer as a counter electrode of a capacitive element included in an active matrix substrate.
FIG. 5(e) is a diagram illustrating a case where a reflective metal layer is formed of the same material in the same layer as a gate electrode of a transistor element included in an active matrix substrate.

(a) of FIG. 5 is a diagram illustrating a first electrode 21, light-emitting layers 2R, 2B, and 2G of respective colors, and a region LRR having a low reflectance which are formed on the active matrix substrate 1 in the display device 20 according to the first embodiment. (b) of FIG. 5 is a diagram illustrating a reflective metal layer 21', light-emitting layers 12R, 12G, and 12B of respective colors, and a region LRR having a low reflectance which are formed on the active matrix substrate 1 in the display device 30 according to the second embodiment, the reflective metal layer 21' being a layer different from the first electrode 21. (c) of FIG. 5 is a diagram illustrating a case where a reflective metal layer SH' is formed of the same material in the same layer as a source electrode S and a drain electrode D of a transistor element TR included in the active matrix substrate 1. (d) of FIG. 5 is a diagram illustrating a case where a reflective metal layer CE' is formed of the same material in the same layer as a counter electrode CE of a capacitive element included in the active matrix substrate 1. (e) of FIG. 5 is a diagram illustrating a case where a reflective metal layer GE' is formed of the same material in the same layer as a gate electrode GE of the transistor element TR included in the active matrix substrate 1.

As illustrated in (a) of FIG. 5, in the case of the light-emitting element layer 2 formed on the active matrix substrate 1 in the display device 20 according to the first embodiment, the first electrode 21 is larger than the light-emitting layers 2R, 2B, and 2G of respective colors, the first region 21a of the first electrode 21 is a region superimposed on the light-emitting layers 2R, 2B, and 2G of respective colors, the second regions 21b of the first electrode 21 is a region other than the region superimposed on the light-emitting layers 2R, 2B, and 2G of respective colors, and the reflective metal layer is the second region 21a of the first electrode 21. In the case of the light-emitting element layer 2, the region LRR having a low reflectance in which the first electrode 21 having light reflectivity is not formed on the active matrix substrate 1 is relatively large, and the reflectance of the light-emitting element layer 2 is, for example, 50%.

Note that, in the case of the light-emitting element layer 2, the first electrode 21 is formed in a large size, and a portion of the first electrode 21 is used as a reflective metal layer, but the embodiment is not limited thereto.

As illustrated in (b) of FIG. 5, in the case of the light-emitting element layer 12 formed on the active matrix substrate 1 in the display device 30 according to the second embodiment, the reflective metal layer 21' and the first electrode (not illustrated) provided on the lower sides of the light-emitting layers 12R, 12G, and 12B of the respective colors are formed on different layers, and the reflective metal layer 21' and the first electrode are formed of different materials. In other words, the reflective metal layer 21', which is larger than the first electrode and the light-emitting layers 12R, 12G, and 12B of the respective colors, is formed on the active matrix substrate 1, and thereafter, the first electrode and the light-emitting layers 12R, 12G, and 1213 of the respective colors having substantially the same size as the first electrode are formed in order through an insulating layer (not illustrated). In this case, it is preferable to use a highly reflective metal material such as Ag or Al as the reflective metal layer 21'. Further, in the present embodiment, the reflective metal layer 21' formed of a material different from that of the first electrode is formed in a projection and recess shape in consideration of the diffusion of reflected light, but the embodiment is not limited thereto. By providing the reflective metal layer 21' on a layer different from that of the first electrode in this manner, the size of the reflective metal layer 21' can be increased, and thus it is possible to reduce the size of the region LRR having a low reflectance in which the reflective metal layer 21' is not formed on the active matrix substrate 1. The reflectance of the tight-emitting element layer 12 is, for example, 80%.

A case where the reflective metal layer 21' and the first electrode are formed of different materials in the tight-emitting element layer 12 has been described as an example, but the reflective metal layer 21' and the first electrode may be formed of the same material.

Furthermore, the reflective metal layer SH' may be formed of the same material in the same layer as the source electrode S and the drain electrode D of the transistor element TR included in the active matrix substrate 1 as illustrated in (c) of FIG. 5, the reflective metal layer CE' may be formed of the same material in the same layer as the counter electrode CE of the capacitive element included in the active matrix substrate 1 as illustrated in (d) of FIG. 5, and the reflective metal layer GE' may be formed of the same material in the same layer as the gate electrode GE of the transistor element TR included in the active matrix substrate 1 as illustrated in (e) of FIG. 5.

Note that the reflective metal layer may be provided by combining a plurality of configurations illustrated in (a) to (e) of FIG. 5.

Furthermore, in the display device 30 according to the present embodiment, in order to confirm how efficiently the utilization of light emitted from the light-emitting element layer 12 can be realized, a front luminance of the display surface of the display device 30 and a front luminance of the display surface of the display device according to the second comparative example that has already been described in the first embodiment are compared with each other.

As a result of comparison between a front luminance of the display surface of the display device 30 and a front luminance of the display surface of the display device according to the second comparative example with respect to the same gray scale signal, it was confirmed that the front luminance of the display surface of the display device 30 was 2.1 times higher than the front luminance of the display surface of the display device according to the second comparative example.

This is due to the fact that the reflectance of the light-emitting element layer 2 is 50%, whereas the reflectance of the light-emitting element layer 12 provided in the display device 30 can be improved to 80%, the diffusion layer 5 having a front transmittance of approximately 85% is omitted, and stray light is suppressed and light extraction efficiency is improved by providing the anti-reflection layer 13.

In addition, in the display device 30, the diffusion of reflected light is improved by forming the reflective metal layer 21' in a projection and recess shape, and thus a satisfactory viewing angle can be secured even when the diffusion layer 5 is omitted. In the present embodiment, a case where the diffusion layer 5 is omitted has been described as an example, but the embodiment is not limited thereto, and another layer having a small degree of diffusion may be used instead of the diffusion layer 5.

Note that, in the present embodiment, a case where the display device 30 includes the light-emitting element layer 12 has been described as an example, but the light-emitting element layer 2 may be provided instead of the light-emitting element layer 12.

Third Embodiment

Next, a third embodiment of the disclosure will be described below with reference to FIG. 6. A display device 40 according to the present embodiment differs from that in the first embodiment in that a diffusion layer 5 is omitted to realize higher utilization efficiency of light, and a reflective layer 14 is provided on the surface of an active matrix substrate 1 on a side opposite to a light-emitting element layer 2 side, and the other configurations are as described in the first embodiment. For convenience of description, members having the same functions as those of the members illustrated in the drawings in the first embodiment are denoted by the same reference numerals, and descriptions thereof will be omitted.

Figure 6:
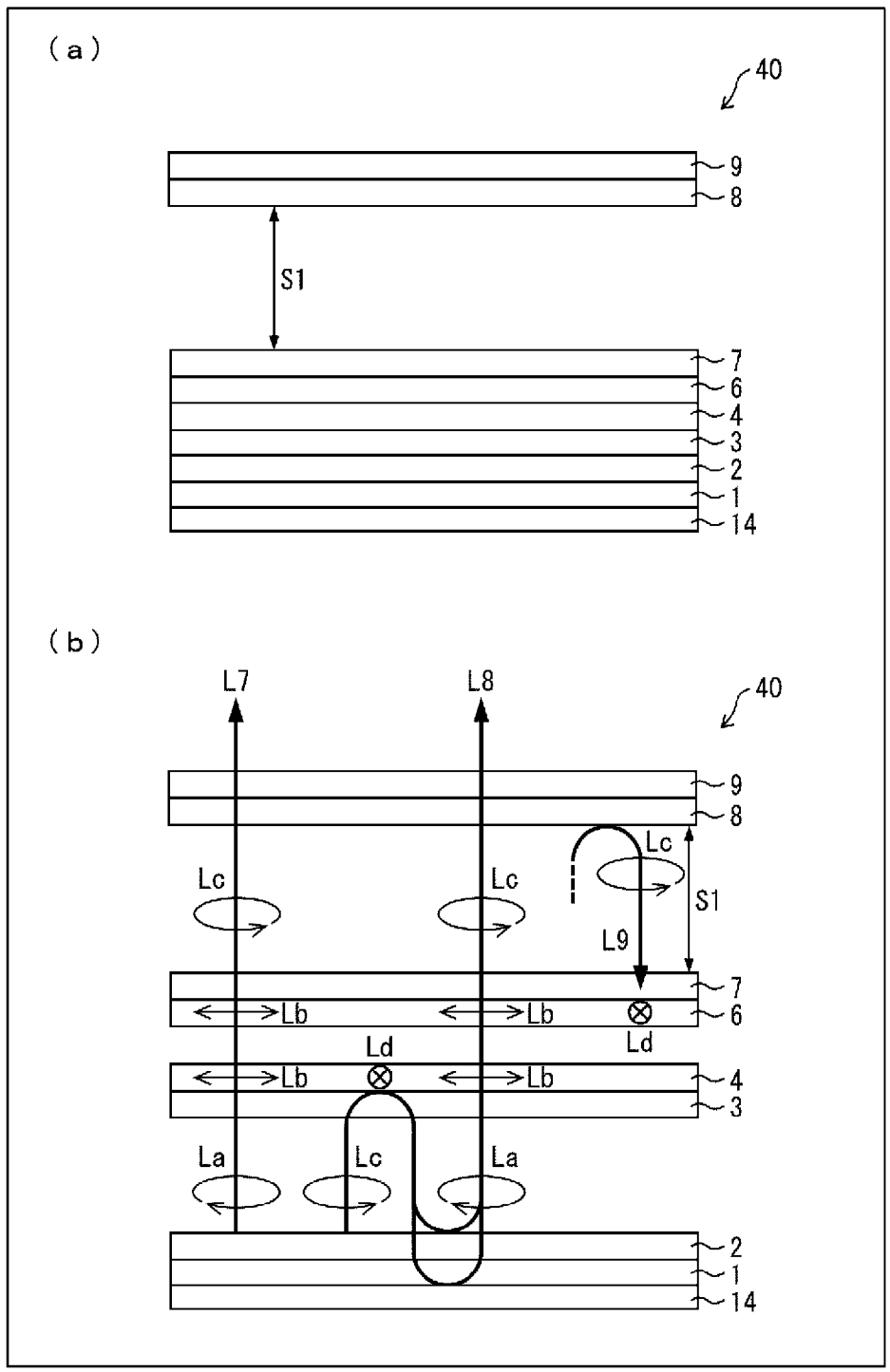
FIG. 6(a) is a diagram illustrating a. schematic configuration of a display device according to a third embodiment.
FIG. 6(b) is a diagram illustrating polarization, reflection, and absorption characteristics of light in the display device according to the third embodiment.

(a) of FIG. 6 is a diagram illustrating a schematic configuration of the display device 40 according to the third embodiment, and (b) of FIG. 6 is a diagram illustrating polarization, reflection, and absorption characteristics of light in the display device 40 according to the third embodiment.

As illustrated in (a) of FIG. 6, the display device 40 includes the active matrix substrate 1 provided with the light-emitting element layer 2, and a half mirror 8 and a protective cover 9 that constitute a hood. in addition, a first λ/4 plate 3, a reflective polarizer 4, an absorbing polarizer 6, and a second λ/4 plate 7 are provided in that order from the light-emitting element layer 2 side between the light-emitting element layer 2 and the half mirror 8. In addition, a space (air layer) S1 of, for example, approximately 10 mm is provided between the second λ/4 plate 7 and the hood, that is, between the second λ/4 plate 7 and the half mirror 8. In addition, a reflective layer 14 is provided on the surface of the active matrix substrate 1 on a side opposite the light-emitting element layer 2 side. In the present embodiment, a reflective sheet of Ag is used as the reflective layer 14, but the embodiment is not limited thereto, and for example, a dielectric multilayer film may be used. The reflective sheet of Ag may be attached to the surface of the active matrix substrate 1 on a side opposite to the light-emitting element layer 2 side using an adhesive layer which is not illustrated in the drawing, Furthermore, the dielectric multilayer film may be formed directly on the surface of the active matrix substrate 1 on a side opposite to the light-emitting element layer 2 side.

As described above, in the case of the light-emitting element layer 2 formed on the active matrix substrate 1 provided with the reflective layer 14, the reflectivity thereof is improved to 98%.

As illustrated in (b) of FIG. 6, unpolarized light including a left-handed circularly polarized component La and a right-handed circularly polarized component Lc is emitted from the light-emitting element layer 2. Among them, the left-handed circularly polarized component La is not reflected and becomes a light component L7 that passes through the hood. On the other hand, the right-handed circularly polarized component Lc is first reflected by the reflective polarizer 4, and is then reflected again by the light-emitting element layer 2, a metal layer included in the active matrix substrate 1 or the reflective layer 14, and then the right-handed circularly polarized component Lc becomes a light component L8 that passes through the hood. As described above, in the display device 40 of the present embodiment, both the left-handed circularly polarized component La and the right-handed circularly polarized component Lc emitted from the light-emitting element layer 2 can be used, and thus it is possible to realize high utilization efficiency of light emitted from the light-emitting element layer 2.

The light component L7 or the light component L8 that passes through the hood is a light component in which a portion of the light component has been reflected by the half mirror 8. A light component L9 reflected by the half mirror 8 in this manner is a light component that may cause a double projection of a video. However, in the display device 40 of the present embodiment, the light component L9 reflected by the half mirror 8 is absorbed by the absorbing polarizer 6, and thus it is possible to suppress a double projection of a video.

Note that it is preferable that, for example, a distance d between the first electrode 21 of the light-emitting element layer 2 and the surface of the reflective layer 14 on the active matrix substrate 1 side and a narrower width W in the width of a subpixel SP illustrated in FIG. 2 satisfy a relationship of d<(W/2) from the point of view of suppressing a double projection (blur) of a video.

Furthermore, in the display device 40 according to the present embodiment, in order to confirm how efficiently the utilization of light emitted from the light-emitting element layer 2 can be realized, a front luminance of the display surface of the display device 40 and a. front luminance of the display surface of the display device according to the second comparative example that has already been described in the first embodiment are compared with each other.

As a result of comparison between a front luminance of the display surface of the display device 40 and a front luminance of the display surface of the display device according to the second comparative example with respect to the same gray scale signal, it was confirmed that the front luminance of the display surface of the display device 40 was 2.3 times higher than the front luminance of the display surface of the display device according to the second comparative example.

Note that in the present embodiment, a case where the display device 40 includes the light-emitting element layer 2 has been described as an example, but the light-emitting element layer 12 may be provided instead of the light-emitting element layer 2.

Fourth Embodiment

Next, a fourth embodiment of the disclosure will be described with reference to FIGS. 7 and 8. The display devices 50 and 50a according to the present embodiment differ from the first embodiment in that a diffusion layer 5 is omitted to realize higher utilization efficiency of light, a second reflective polarizer 15 is provided, and a light-emitting element layer 12 having a high reflectance is used, and the other configurations are as described in the first embodiment. For convenience of description, members having the same functions as those of the members illustrated in the drawings in the first embodiment are denoted by the same reference numerals, and descriptions thereof will be omitted.

Figure 7:
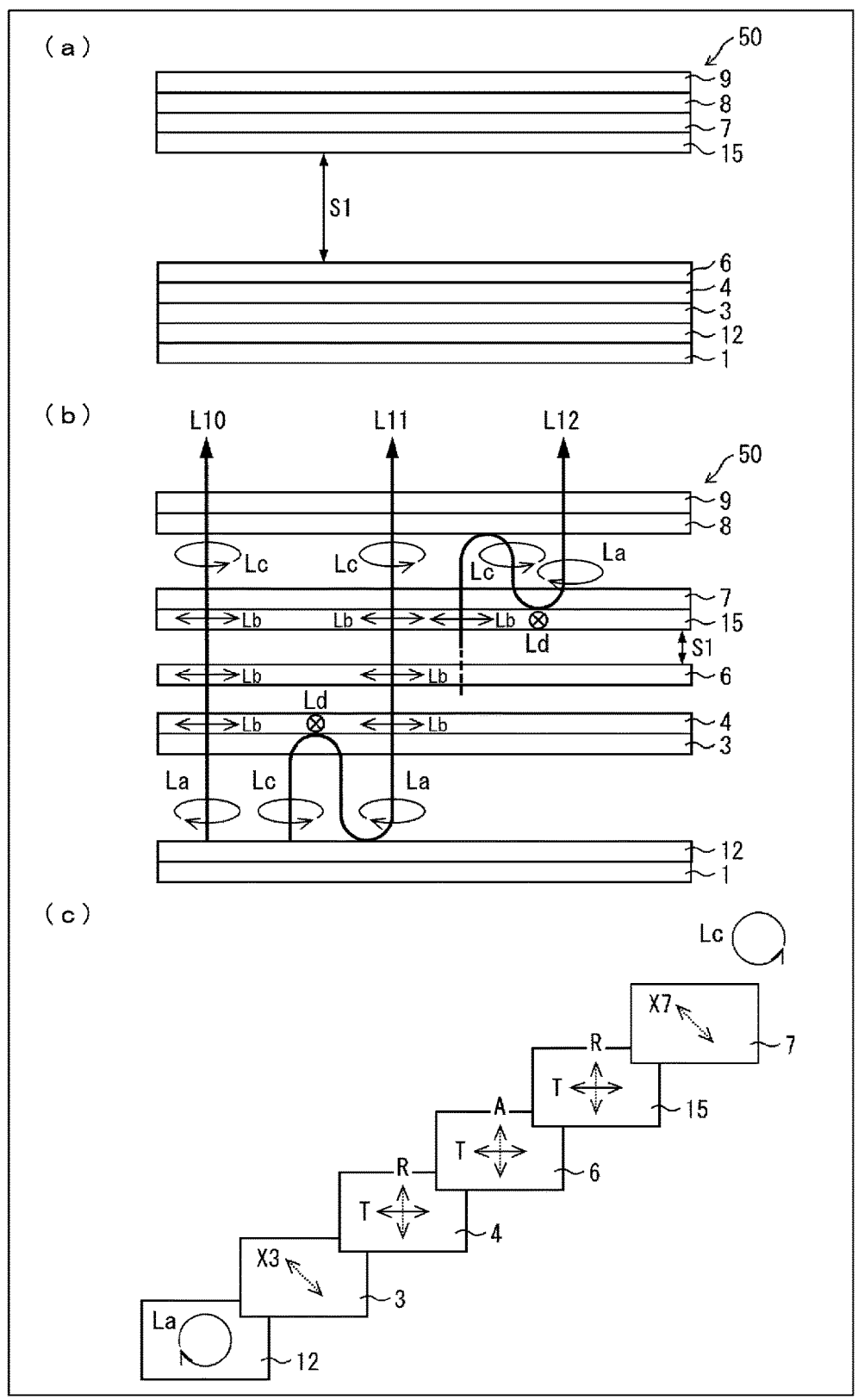
FIG. 7(a) is a diagram illustrating a schematic configuration of a display device according to a fourth embodiment.
FIGS. 7(b) and 7(c) are diagrams illustrating polarization, reflection, and absorption characteristics of light in the display device according to the fourth embodiment.

(a) of FIG. 7 is a diagram illustrating a schematic configuration of a display device 50 according to the fourth embodiment, and (b) of FIG. 7 is a diagram illustrating polarization, reflection, and absorption characteristics of light in the display device 50 according to the fourth embodiment.

As illustrated in (a) of FIG. 7, the display device 50 includes an active matrix substrate 1 provided with the light-emitting element layer 12, and a half mirror 8 and a protective cover 9 that constitute a hood. In addition, a first λ/4 plate 3, a reflective polarizer 4, an absorbing polarizer 6, the second reflective polarizer 15, and a second λ/4 plate 7 are provided in that order from the light-emitting element layer 12 side between the light-emitting element layer 12 and the half mirror 8. In addition, a space (air layer) S1 of, for example, approximately 10 mm is provided between the absorbing polarizer 6 and the second reflective polarizer 15.

Note that the reflective polarizer 4 and the second reflective polarizer 15 are the same reflective polarizers. In addition, the reflective polarizer 4 is an example of a first reflective polarizer in claims.

As illustrated in (b) of FIG. 7, unpolarized light including a left-handed circularly polarized component La and a right-handed circularly polarized component Lc is emitted from the light-emitting element layer 12. Among them, the left-handed circularly polarized component La is not reflected and becomes a light component L10 that passes through the hood. On the other hand, the right-handed circularly polarized component is first reflected by the reflective polarizer 4, and is then reflected again by the light-emitting element layer 12 or a metal layer included in the active matrix substrate 1, and then the right-handed circularly polarized component Lc becomes a light component L11 that passes through the hood. As described above, in the display device 50 of the present embodiment, both the left-handed circularly polarized component La and the right-handed circularly polarized component Lc emitted from the light-emitting element layer 12 can be utilized, and thus it is possible to realize high utilization efficiency of light emitted from the light-emitting element layer 12.

The light component L10 or the light component L11 that passes through the hood is a light component in which a portion of the light component has been reflected by the half mirror 8. A light component L12 reflected by the half mirror 8 in this manner is a light component that may cause a double projection of a video. However, in the display device 50 of the present embodiment, the light component L12 reflected by the half mirror 8 is a light component that passes through the hood by the second reflective polarizer 15. Thus, it is possible to suppress a double projection of a video.

As illustrated in (c) of FIG. 7, a transmission axis T of the reflective polarizer 4 and a reflection axis R of the reflective polarizer 4 are orthogonal to each other (form an angle of 90 degrees), and a transmission axis T of the second reflective polarizer 15 and a reflection axis R of the second reflective polarizer 15 are orthogonal to each other (form an angle of 90 degrees). In addition, an angle formed by the transmission axis T of the reflective polarizer 4 and the transmission axis T of the second reflective polarizer 15 and an angle formed by the reflection axis R of the reflective polarizer 4 and the reflection axis R of the second reflective polarizer 15 are 0 degrees, and an angle formed by a slow axis X3 of the first λ/4 plate 3 and a slow axis X7 of the second λ/4 plate 7 is 0 degrees. Furthermore, an angle formed by the slow axis X3 of the first λ/4 plate 3 and the transmission axis T of the reflective polarizer 4, an angle formed by the slow axis X3 of the first λ/4 plate 3 and the reflection axis R of the reflective polarizer 4, an angle formed by the slow axis X7 of the second λ/4 plate 7 and the transmission axis T of the second reflective polarizer 15, and an angle formed by the slow axis X7 of the second λ/4 plate 7 and the reflection axis R of the second reflective polarizer 15 are 45 degrees. An angle formed by the transmission axis T of the reflective polarizer 4 and a transmission axis T of the absorbing polarizer 6, an angle formed by the transmission axis T of the second reflective polarizer 15 and the transmission axis T of the absorbing polarizer 6, an angle formed by the reflection axis R of the reflective polarizer 4 and an absorption axis A of the absorbing polarizer 6, and an angle formed by the reflection axis R of the second reflective polarizer 15 and the absorption axis A of the absorbing polarizer 6 are 0 degrees.

Note that a disposition relationship between the first λ/4 plate 3, the reflective polarizer 4, the absorbing polarizer 6, the second reflective polarizer 15, and the second λ/4 plate 7 is not limited thereto, and there are effects such as variations in the accuracy of design of the first λ/4 plate 3, the reflective polarizer 4, the absorbing polarizer 6, the second reflective polarizer 15, and the second λ/4 plate 7 and variations in the accuracy of disposition of these members, and thus the above-described angles such as 90 degrees, 45 degrees, and 0 degrees are not exact angles and include variations within a range of, for example, +5 degrees to −5 degrees.

Furthermore, in the display device 50 according to the present embodiment, in order to confirm how efficiently the utilization of light emitted from the light-emitting element layer 12 can be realized, a front luminance of the display surface of the display device 50 and a front luminance of the display surface of the display device according to the second comparative example that has already been described in the first embodiment are compared with each other.

As a result of comparison between a front luminance of the display surface of the display device 50 and a front luminance of the display surface of the display device according to the second comparative example with respect to the same gray scale signal, it was confirmed that the front luminance of the display surface of the display device 50 was 2.3 times higher than the front luminance of the display surface of the display device according to the second comparative example.

Figure 8:
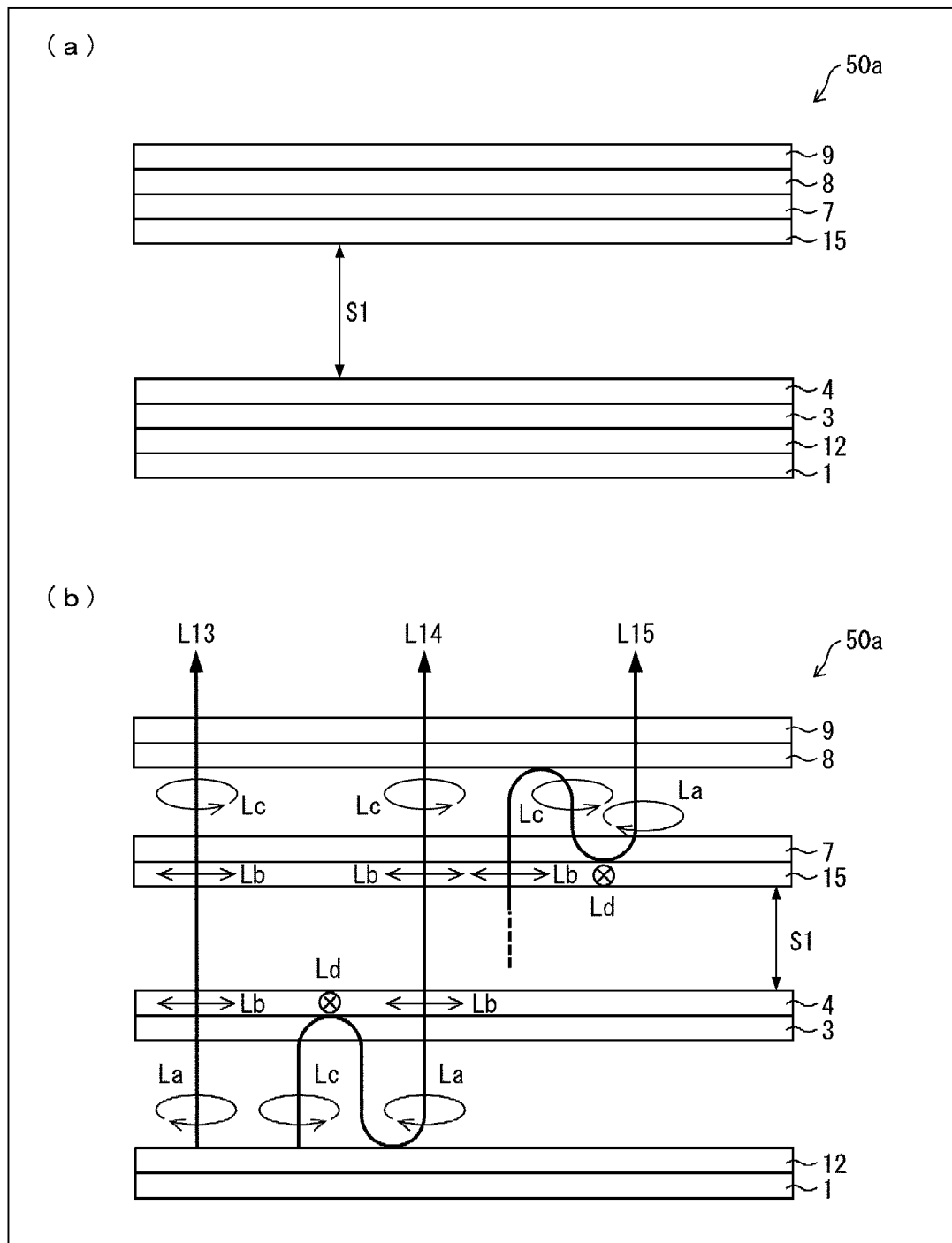
FIG. 8(a) is a diagram illustrating a schematic configuration of a display device according to a modification example of the fourth embodiment.
FIG. 8(b) is a diagram illustrating polarization, reflection, and absorption characteristics of light in the display device according to the modification example of the fourth embodiment.

(a) of FIG. 8 is a diagram illustrating a schematic configuration of a display device 50a according to a modification example of the fourth embodiment, and FIG. 8(b) is a diagram illustrating polarization, reflection, and absorption characteristics of light in the display device 50a according to the modification example of the fourth embodiment.

As illustrated in (a) of FIG. 8, the display device 50a includes an active matrix substrate 1 provided with a light-emitting element layer 12, and a half mirror 8 and a protective cover 9 that constitute a hood. In addition, a first λ/4 plate 3, a reflective polarizer 4, a second reflective polarizer 15, and a second λ/4 plate 7 are provided in that order from the light-emitting element layer 12 side between the light-emitting element layer 12 and the half mirror 8. In addition, a space (air layer) S1 of, for example, approximately 10 mm is provided between the reflective polarizer 4 and the second reflective polarizer 15.

As illustrated in (b) of FIG. 8, unpolarized light including a left-handed circularly polarized component La and a right-handed circularly polarized component Lc is emitted from the light-emitting element layer 12. Among them, the left-handed circularly polarized component La is not reflected and becomes a light component L13 that passes through the hood. On the other hand, the right-handed circularly polarized component Lc is first reflected by the reflective polarizer 4, and is then reflected again by the light-emitting element layer 12 or a metal layer included in the active matrix substrate 1, and then the right-handed circularly polarized component Lc becomes a light component L14 that passes through the hood. As described above, in the display device 50a of the present embodiment, both the left-handed circularly polarized component La and the right-handed circularly polarized component Lc emitted from the light-emitting element layer 12 can be utilized, and thus it is possible to realize high utilization efficiency of light emitted from the light-emitting element layer 12.

The light component L13 or the light component L14 that passes through the hood is a light component in which a portion of the light component has been reflected by the half mirror 8. A light component L15 reflected by the half mirror 8 in this manner is a light component that may cause a double projection of a video. However, in the display device 50a of the present embodiment, the light component L12 reflected by the half mirror 8 is a light component that passes through the hood by the second reflective polarizer 15. Thus, it is possible to suppress a double projection of a video.

Note that, in the present embodiment, a case where the display devices 50 and 50a include the light-emitting element layer 12 has been described as an example, but the light-emitting element layer 2 may be provided instead of the light-emitting element layer 12.

Fifth Embodiment

Next, a fifth embodiment of the disclosure will be described with reference to FIG. 9. A display device 60 according to the present embodiment differs from that in the first embodiment in that a diffusion layer 5 and a second λ/4 plate 7 are omitted in order to realize a reduction in cost, and the other configurations are as described in the first embodiment. For convenience of description, members having the same functions as those of the members illustrated in the drawings in the first embodiment are denoted by the same reference numerals, and descriptions thereof will be omitted.

Figure 9:
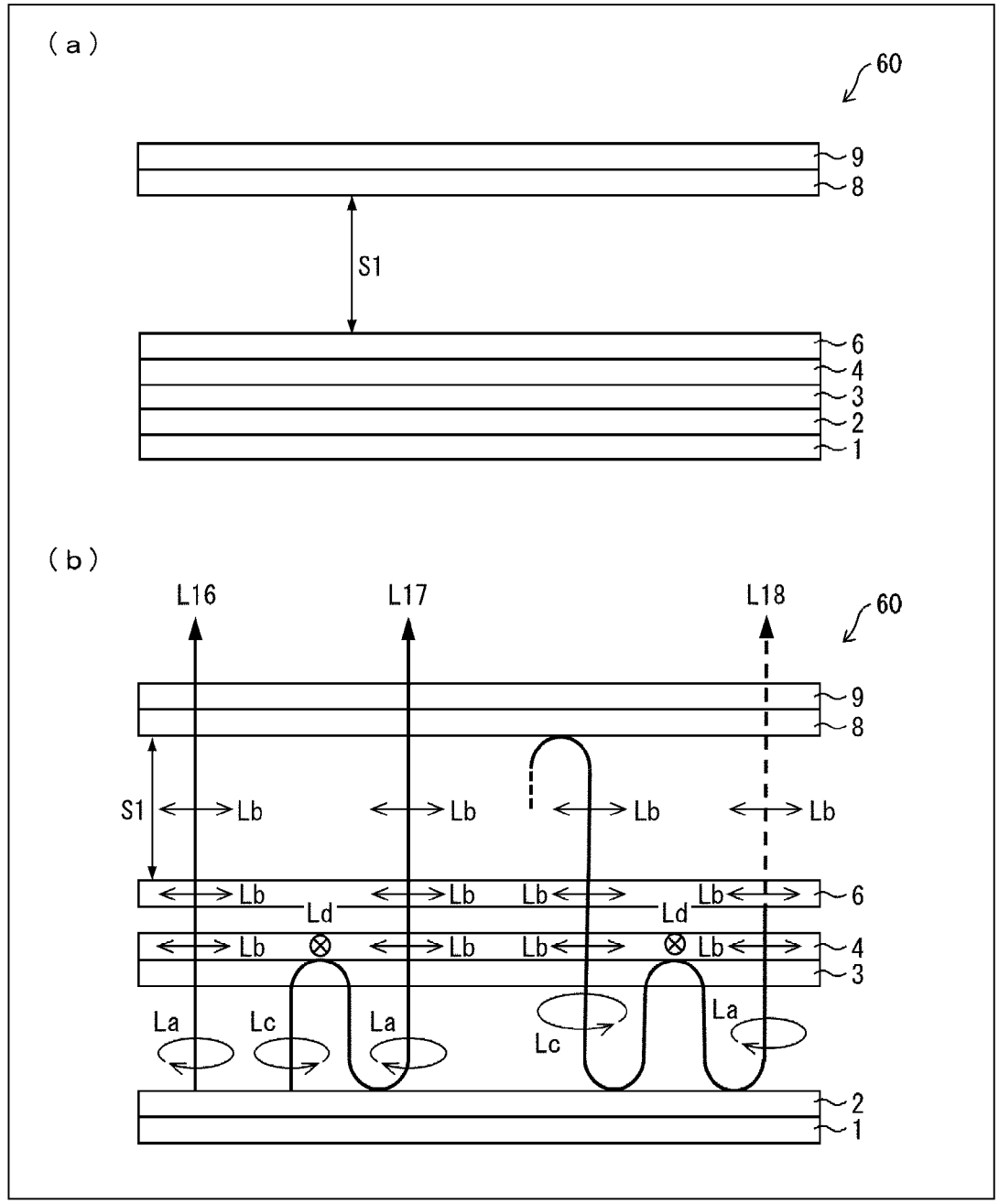
FIG. 9(a) is a diagram illustrating a schematic configuration of a display device according to a fifth embodiment.
FIG. 9(b) is a diagram illustrating polarization, reflection, and absorption characteristics of light in the display device according to the fifth embodiment.

(a) of FIG. 9 is a diagram illustrating a schematic configuration of the display device 60 according to the fifth embodiment, and (b) of FIG. 9 is a diagram illustrating polarization, reflection, and absorption characteristics of light in the display device 60 according to the fifth embodiment.

As illustrated in (a) of FIG. 9, the display device 60 includes an active matrix substrate 1 provided with a light-emitting element layer 2, and a half mirror 8 and a protective cover 9 that constitute a hood. In addition, a first λ/4 plate 3, a reflective polarizer 4, and an absorbing polarizer 6 are provided in that order from the light-emitting element layer 2 side between the light-emitting element layer 2 and the half mirror 8. In addition, a space (air layer) S1 of, for example, approximately 10 mm is provided between the absorbing polarizer 6 and the hood, that is, between the absorbing polarizer 6 and the half mirror 8.

As illustrated in (b) of FIG. 9, unpolarized light including the left-handed circularly polarized component La and the right-handed circularly polarized component Lc is emitted from the light-emitting element layer 2. Among them, the left-handed circularly polarized component La is not reflected and becomes a light component L16 that passes through the hood. On the other hand, the right-handed circularly polarized component Lc is first reflected by the reflective polarizer 4, and is then reflected again by the light-emitting element layer 2 or a metal layer included in the active matrix substrate 1, and then the right-handed circularly polarized component Lc becomes a light component L17 that passes through the hood. As described above, in the display device 60 of the present embodiment, both the left-handed circularly polarized component and the right-handed circularly polarized component Lc emitted from the light-emitting element layer 2 can be used, and thus it is possible to realize high utilization efficiency of light emitted from the light-emitting element layer 2.

The light component L16 or the light component L17 that passes through the hood is a light component in which a portion of the light component has been reflected by the half mirror 8. A light component L18 reflected by the half mirror 8 in this manner is a light component that may cause a double projection of a video. However, in the display device 60 of the present embodiment, the light component L18 can be attenuated due to two reflections by the light-emitting element layer 2 or the metal layer included in the active matrix substrate 1 and the passage of the absorbing polarizer 6, and thus it is possible to suppress a double projection of a video.

Note that in the present embodiment, a case where the display device 60 includes the light-emitting element layer 2 has been described as an example, but the light-emitting element layer 12 may be provided instead of the light-emitting element layer 2.

Supplement

First Aspect

A display device including an active matrix substrate including a transistor element, and a light-emitting element layer provided on the active matrix substrate and including a first electrode, a second electrode, a function layer including a light-emitting layer between the first electrode and the second electrode, and a sealing layer, the display device including:

a half mirror provided on a display surface side of the light-emitting element layer; and a first λ/4 plate, a reflective polarizer, and an absorbing polarizer which are provided in order from the light-emitting element layer side between the light-emitting element layer and the half mirror.

Second Aspect

The display device according to the first aspect, further including:

a second λ/4 plate, wherein the second λ/4 plate is provided on the half mirror side of the absorbing polarizer.

Third Aspect

The display device according to the second aspect, further including:

an anti-reflection layer, wherein the anti-reflection layer is provided on the half mirror side of the second λ/4 plate.

Fourth Aspect

The display device according to any one of the first to third aspects, wherein an air layer is provided between the half mirror and the reflective polarizer.

Fifth Aspect

The display device according to the second or third aspect, wherein an air layer is provided between the second λ/4 plate and the half mirror.

Sixth Aspect

The display device according to the third aspect, wherein an air layer is provided between the anti-reflection layer and the half mirror.

Seventh Aspect

The display device according to any one of the first to sixth aspects, wherein the first λ/4 plate, the reflective polarizer, and the absorbing polarizer are provided in that order on a surface of the light-emitting element layer on the half mirror side, and an air layer is provided between the absorbing polarizer and the half mirror.

Eighth Aspect

The display device according to any one of the first to seventh aspects, wherein a transmission axis of the reflective polarizer and a reflection axis of the reflective polarizer are orthogonal to each other, an angle formed by a slow axis of the first λ/4 plate and the transmission axis of the reflective polarizer and an angle formed by the slow axis of the first λ/4 plate and the reflection axis of the reflective polarizer are 45 degrees, and an angle formed by the transmission axis of the reflective polarizer and a transmission axis of the absorbing polarizer is 0 degrees.

Ninth Aspect

The display device according to any one of the second, third, fifth, and sixth aspects, wherein the transmission axis of the reflective polarizer and the reflection axis of the reflective polarizer are orthogonal to each other, an angle formed by the slow axis of the first λ/4 plate and a slow axis of the second λ/4 plate is 0 degrees, an angle formed by the slow axis of the first λ/4 plate and the transmission axis of the reflective polarizer, an angle formed by the slow axis of the first λ/4 plate and the reflection axis of the reflective polarizer, an angle formed by the slow axis of the second λ/4 plate and the transmission axis of the reflective polarizer, and an angle formed by the slow axis of the second λ/4 plate and the reflection axis of the reflective polarizer are 45 degrees, and an angle formed by the transmission axis of the reflective polarizer and the transmission axis of the absorbing polarizer is 0 degrees.

Tenth Aspect

The display device according to the eighth or ninth aspect, wherein an angle formed by the reflection axis of the reflective polarizer and an absorption axis of the absorbing polarizer is 0 degrees.

Eleventh Aspect

A display device including an active matrix substrate including a transistor element, and a light-emitting element layer provided on the active matrix substrate and including a first electrode, a second electrode, a function layer including a light-emitting layer between the first electrode and the second electrode, and a sealing layer, the display device including:

a half mirror provided on a display surface side of the light-emitting element layer; and a first λ/4 plate, a first reflective polarizer, a second reflective polarizer, and a second λ/4 plate which are provided in order from the light-emitting element layer side between the light-emitting element layer and the half mirror.

Twelfth Aspect

The display device according to the eleventh aspect, wherein an air layer is provided between the half mirror and the first reflective polarizer.

Thirteenth Aspect

The display device according to the eleventh aspect, wherein the second λ/4 plate and the second reflective polarizer are provided in that order on a surface of the half mirror on the light-emitting element layer side, the first λ/4 plate and the first reflective polarizer are provided in that order on a surface of the light-emitting element layer on the half mirror side, and an air layer is provided between the second reflective polarizer and the first reflective polarizer.

Fourteenth Aspect

The display device according to the eleventh aspect, further including:

an absorbing polarizer, wherein the absorbing polarizer is provided on the half mirror side of the first reflective polarizer.

Fifteenth Aspect

The display device according to the fourteenth aspect, wherein the second λ/4 plate and the second reflective polarizer are provided in that order on a surface of the half mirror on the light-emitting element layer side, the first λ/4 plate, the first reflective polarizer, and the absorbing polarizer are provided in that order on a surface of the light-emitting element layer on the half mirror side, and an air layer is provided between the second reflective polarizer and the absorbing polarizer.

Sixteenth Aspect

The display device according to any one of the eleventh to thirteenth aspects, wherein a transmission axis of the first reflective polarizer and a reflection axis of the first reflective polarizer are orthogonal to each other, a transmission axis of the second reflective polarizer and a reflection axis of the second reflective polarizer are orthogonal to each other, an angle formed by the transmission axis of the first reflective polarizer and the transmission axis of the second reflective polarizer and an angle formed by the reflection axis of the first reflective polarizer and the reflection axis of the second reflective polarizer are 0 degrees, an angle formed by a slow axis of the first λ/4 plate and a slow axis of the second λ/4 plate is 0 degrees, and an angle formed by the slow axis of the first λ/4 plate and the transmission axis of the first reflective polarizer, an angle formed by the slow axis of the first λ/4 plate and the reflection axis of the first reflective polarizer, and an angle formed by a slow axis of the second λ/4 plate and the transmission axis of the second reflective polarizer and an angle formed by the slow axis of the second λ/4 plate and the reflection axis of the second reflective polarizer are 45 degrees.

Seventeenth Aspect

The display device according to the fourteenth or fifteenth aspect, wherein the transmission axis of the first reflective polarizer and the reflection axis of the first reflective polarizer are orthogonal to each other, the transmission axis of the second reflective polarizer and the reflection axis of the second reflective polarizer are orthogonal to each other, an angle formed by the transmission axis of the first reflective polarizer and the transmission axis of the second reflective polarizer and an angle formed by the reflection axis of the first reflective polarizer and the reflection axis of the second reflective polarizer are 0 degrees, an angle formed by the slow axis of the first λ/4 plate and the slow axis of the second λ/4 plate is 0 degrees, an angle formed by the slow axis of the first λ/4 plate and the transmission axis of the first reflective polarizer, an angle formed by the slow axis of the first λ/4 plate and the reflection axis of the first reflective polarizer, an angle formed by the slow axis of the second λ/4 plate and the transmission axis of the second reflective polarizer, and an angle formed by the slow axis of the second λ/4 plate and the reflection axis of the second reflective polarizer are 45 degrees, and an angle formed by the transmission axis of the first reflective polarizer and the transmission axis of the absorbing polarizer, an angle formed by the transmission axis of the second reflective polarizer and the transmission axis of the absorbing polarizer, an angle formed by the reflection axis of the first reflective polarizer and an absorption axis of the absorbing polarizer, and an angle formed by the reflection axis of the second reflective polarizer and the absorption axis of the absorbing polarizer are 0 degrees.

Eighteenth Aspect

The display device according to any one of the first to tenth aspects, further including:
a diffusion layer,
wherein the diffusion layer is provided between the reflective polarizer and the absorbing polarizer.

Nineteenth Aspect

The display device according to any one of the fourteenth, fifteenth, and seventeenth aspects, further including:
a diffusion layer,
wherein the diffusion layer is provided between the first reflective polarizer and the absorbing polarizer.

Twentieth Aspect

The display device according to any one of the first to nineteenth aspects,
wherein the active matrix substrate is provided with a reflective metal layer.

Twenty-First Aspect

The display device according to the twentieth aspect,
wherein the first electrode is provided closer to the active matrix substrate than the second electrode,
the active matrix substrate is provided with an edge cover that covers an end portion of the first electrode, and
the reflective metal layer is superimposed on the edge cover.

Twenty-Second Aspect

The display device according to the twentieth or twenty-first aspect,
wherein the reflective metal layer is formed of the same material in the same layer as the first electrode.

Twenty-Third Aspect

The display device according to the twenty-second aspect,
wherein the first electrode is larger than the light-emitting layer,
a first region of the first electrode is a region superimposed on the light-emitting layer,
a second region of the first electrode is a region other an the region superimposed on the light-emitting layer, and
the reflective metal layer is the second region of the first electrode.

Twenty-Fourth Aspect

The display device according to the twentieth or twenty-first aspect,
wherein the reflective metal layer and the first electrode are formed on different layers, and
the reflective metal layer and the first electrode are formed of the same material.

Twenty-Fifth Aspect

The display device according to the twentieth or twenty-first aspect,
wherein the reflective metal layer and the first electrode are formed on different layers, and
the reflective metal layer and the first electrode are formed of different materials.

Twenty-Sixth Aspect

The display device according to the twenty-fifth aspect,
wherein the reflective metal layer is formed of the same material in the same layer as one or more electrodes selected from a gate electrode of a transistor element, a source electrode and a drain electrode of the transistor element, and a counter electrode of a capacitive element which are included in the active matrix substrate.

Twenty-Seventh Aspect

The display device according to any one of the first to twenty-sixth aspects, further including:
a reflective layer,
wherein the reflective layer is provided on a surface of the active matrix substrate on a side opposite to the light-emitting element layer side.

Twenty-Eighth Aspect

The display device according to the twenty-fourth or twenty-fifth aspect,
wherein the reflective metal layer is formed in a projection and recess shape.

Twenty-Ninth Aspect

The display device according to any one of the first to twenty-eighth aspects, further including:
a protective cover,
wherein the protective cover is provided on a surface of the half mirror on a side opposite to the light-emitting element layer side.

Thirtieth Aspect

The display device according to the twenty-ninth aspect, further including:
a touch panel,
wherein the touch panel is provided on a surface of the protective cover on a side opposite to the light-emitting element layer side.

Thirty-First Aspect

The display device according to any one of the first to twenty-ninth aspects, further including:
a touch panel,
wherein the touch panel is provided on a surface of the half mirror on the light-emitting element layer side.

Thirty-Second Aspect

The display device according to any one of the first to twenty-ninth aspects, further including:
a touch panel,
wherein the touch panel is provided between the light-emitting element layer and the first λ/4 plate.

Additional Items

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

INDUSTRIAL APPLICABILITY

The disclosure can be utilized for a display device.

The invention claimed is:

1. A display device including an active matrix substrate and a light-emitting element layer, the active matrix substrate including a transistor element, the light-emitting element layer provided on the active matrix substrate and including a first electrode, a second electrode, a function layer including a light-emitting layer between the first electrode and the second electrode, and a sealing layer, the display device comprising:
   a half mirror provided on a display surface side of the light-emitting element layer; and
   a first λ/4 plate, a reflective polarizer, and an absorbing polarizer, which are provided in order from a light-emitting element layer side and between the light-emitting element layer and the half mirror.

2. The display device according to claim 1, further comprising:
   a second λ/4 plate,
   wherein the second λ/4 plate is provided on a half mirror side of the absorbing polarizer.

3. The display device according to claim 2, further comprising:
   an anti-reflection layer,
   wherein the anti-reflection layer is provided on a half mirror side of the second λ/4 plate.

4. The display device according to claim 3,
   wherein an air layer is provided between the anti-reflection layer and the half mirror.

5. The display device according to claim 2,
   wherein an air layer is provided between the second λ/4 plate and the half mirror.

6. The display device according to claim 2,
   wherein a transmission axis of the reflective polarizer and a reflection axis of the reflective polarizer are orthogonal to each other,
   an angle formed by a slow axis of the first λ/4 plate and a slow axis of the second λ/4 plate is 0 degrees,
   an angle formed by the slow axis of the first λ/4 plate and the transmission axis of the reflective polarizer, an angle formed by the slow axis of the first λ/4 plate and the reflection axis of the reflective polarizer, an angle formed by the slow axis of the second λ/4 plate and the transmission axis of the reflective polarizer, and an angle formed by the slow axis of the second λ/4 plate and the reflection axis of the reflective polarizer are 45 degrees, and
   an angle formed by the transmission axis of the reflective polarizer and a transmission axis of the absorbing polarizer is 0 degrees.

7. The display device according to claim 1,
   wherein an air layer is provided between the half mirror and the reflective polarizer.

8. The display device according to claim 1, further comprising:
   a diffusion layer,
   wherein the diffusion layer is provided between the reflective polarizer and the absorbing polarizer.

9. The display device according to claim 1,
   wherein the active matrix substrate is provided with a reflective metal layer,
   the reflective metal layer and the first electrode are formed on different layers, and
   the reflective metal layer and the first electrode are formed of a same material.

10. The display device according to claim 9,
    wherein the reflective metal layer is formed in a projection and recess shape.

11. The display device according to claim 1,
    wherein the active matrix substrate is provided with a reflective metal layer,
    the reflective metal layer and the first electrode are formed on different layers, and
    the reflective metal layer and the first electrode are formed of different materials.

12. The display device according to claim 1, further comprising:
    a reflective layer,
    wherein the reflective layer is provided on a surface of the active matrix substrate on a side opposite the light-emitting element layer side.

13. A display device including an active matrix substrate and a light-emitting element layer, the active matrix substrate including a transistor element, the light-emitting element layer provided on the active matrix substrate and including a first electrode, a second electrode, a function layer including a light-emitting layer between the first electrode and the second electrode, and a sealing layer, the display device comprising:
    a half mirror provided on a display surface side of the light-emitting element layer; and
    a first λ/4 plate, a first reflective polarizer, a second reflective polarizer, and a second λ/4 plate, which are provided in order from a light-emitting element layer side and between the light-emitting element layer and the half mirror.

14. The display device according to claim 13,
    wherein an air layer is provided between the half mirror and the first reflective polarizer.

15. The display device according to claim 13,
    wherein the second λ/4 plate and the second reflective polarizer are provided in that order on a surface of the half mirror on the light-emitting element layer side,
    the first λ/4 plate and the first reflective polarizer are provided in that order on a surface of the light-emitting element layer on a half mirror side, and
    an air layer is provided between the second reflective polarizer and the first reflective polarizer.

16. The display device according to claim 13, further comprising:
    an absorbing polarizer,
    wherein the absorbing polarizer is provided on a half mirror side of the first reflective polarizer.

17. The display device according to claim 16,
    wherein the second λ/4 plate and the second reflective polarizer are provided in that order on a surface of the half mirror on the light-emitting element layer side,
    the first λ/4 plate, the first reflective polarizer, and the absorbing polarizer are provided in that order on a surface of the light-emitting element layer on a half mirror side, and
    an air layer is provided between the second reflective polarizer and the absorbing polarizer.

18. The display device according to claim 16,
    wherein a transmission axis of the first reflective polarizer and a reflection axis of the first reflective polarizer are orthogonal to each other, a transmission axis of the second reflective polarizer and a reflection axis of the second reflective polarizer are orthogonal to each other, an angle formed by the transmission axis of the first reflective polarizer and the transmission axis of the second reflective polarizer and an angle formed by the reflection axis of the first reflective polarizer and the reflection axis of the second reflective polarizer are 0 degrees, an angle formed by a slow axis of the first $\lambda/4$ plate and a slow axis of the second $\lambda/4$ plate is 0 degrees, an angle formed by the slow axis of the first $\lambda/4$ plate and the transmission axis of the first reflective polarizer, an angle formed by the slow axis of the first $\lambda/4$ plate and the reflection axis of the first reflective polarizer, an angle formed by the slow axis of the second $\lambda/4$ plate and the transmission axis of the second reflective polarizer, and an angle formed by the slow axis of the second $\lambda/4$ plate and the reflection axis of the second reflective polarizer are 45 degrees, and an angle formed by the transmission axis of the first reflective polarizer and a transmission axis of the absorbing polarizer, an angle formed by the transmission axis of the second reflective polarizer and the transmission axis of the absorbing polarizer, an angle formed by the reflection axis of the first reflective polarizer and an absorption axis of the absorbing polarizer, and an angle formed by the reflection axis of the second reflective polarizer and the absorption axis of the absorbing polarizer are 0 degrees.

19. The display device according to claim 16, further comprising:

a diffusion layer, wherein the diffusion layer is provided between the first reflective polarizer and the absorbing polarizer.

20. The display device according to claim 13, wherein a transmission axis of the first reflective polarizer and a reflection axis of the first reflective polarizer are orthogonal to each other, a transmission axis of the second reflective polarizer and a reflection axis of the second reflective polarizer are orthogonal to each other, an angle formed by the transmission axis of the first reflective polarizer and the transmission axis of the second reflective polarizer and an angle formed by the reflection axis of the first reflective polarizer and the reflection axis of the second reflective polarizer are 0 degrees, an angle formed by a slow axis of the first $\lambda/4$ plate and a slow axis of the second $\lambda/4$ plate is 0 degrees, and an angle formed by the slow axis of the first $\lambda/4$ plate and the transmission axis of the first reflective polarizer, an angle formed by the slow axis of the first $\lambda/4$ plate and the reflection axis of the first reflective polarizer, an angle formed by the slow axis of the second $\lambda/4$ plate and the transmission axis of the second reflective polarizer, and an angle formed by the slow axis of the second $\lambda/4$ plate and the reflection axis of the second reflective polarizer are 45 degrees.

* * * * *